(12) United States Patent
Huang et al.

(10) Patent No.: US 7,915,597 B2
(45) Date of Patent: Mar. 29, 2011

(54) EXTRACTION ELECTRODE SYSTEM FOR HIGH CURRENT ION IMPLANTER

(75) Inventors: Yongzhang Huang, Hamilton, MA (US); Ilya Pokidov, Allston, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 329 days.

(21) Appl. No.: 12/050,594

(22) Filed: Mar. 18, 2008

(65) Prior Publication Data
US 2009/0236547 A1 Sep. 24, 2009

(51) Int. Cl.
*H01J 3/14* (2006.01)
(52) U.S. Cl. .................... 250/396 R; 250/397
(58) Field of Classification Search .................. None
See application file for complete search history.

(56) References Cited

U.S. PATENT DOCUMENTS

| | | | | |
|---|---|---|---|---|
| 4,578,589 | A * | 3/1986 | Aitken | 250/492.2 |
| 4,782,304 | A * | 11/1988 | Aitken | 315/506 |
| 4,847,504 | A * | 7/1989 | Aitken | 250/492.2 |
| 4,857,809 | A * | 8/1989 | Torii et al. | 315/111.31 |
| 4,943,728 | A | 7/1990 | Dykstra et al. | |
| 5,026,997 | A | 6/1991 | Benveniste | |
| 5,134,301 | A * | 7/1992 | Kamata et al. | 250/492.2 |
| 5,244,820 | A * | 9/1993 | Kamata et al. | 438/514 |
| 5,420,415 | A | 5/1995 | Trueira | |
| 5,504,340 | A * | 4/1996 | Mizumura et al. | 250/492.21 |
| 5,583,344 | A * | 12/1996 | Mizumura et al. | 250/492.21 |
| 5,825,035 | A * | 10/1998 | Mizumura et al. | 250/423 R |
| 5,834,786 | A * | 11/1998 | White et al. | 250/492.21 |
| 5,886,355 | A | 3/1999 | Bright et al. | |
| 5,914,494 | A | 6/1999 | Abbott | |
| 6,180,954 | B1 * | 1/2001 | Verrier et al. | 250/492.21 |
| 6,194,734 | B1 | 2/2001 | Loomis et al. | |
| 6,356,026 | B1 | 3/2002 | Murto | |
| 6,559,454 | B1 * | 5/2003 | Murrell et al. | 250/423 R |
| 6,573,510 | B1 | 6/2003 | Vella | |
| 6,803,590 | B2 * | 10/2004 | Brailove et al. | 250/492.22 |
| 6,897,457 | B1 * | 5/2005 | Holmes et al. | 250/492.21 |
| 7,064,491 | B2 * | 6/2006 | Horsky et al. | 315/111.81 |
| 7,105,839 | B2 * | 9/2006 | White | 250/492.21 |
| 7,394,202 | B2 * | 7/2008 | Horsky et al. | 315/111.81 |
| 7,488,958 | B2 * | 2/2009 | Huang | 250/492.21 |
| 7,528,550 | B2 * | 5/2009 | Horsky et al. | 315/111.81 |
| 7,609,003 | B2 * | 10/2009 | Horsky et al. | 315/111.81 |
| 2002/0043621 | A1 * | 4/2002 | Aitken | 250/281 |

(Continued)

FOREIGN PATENT DOCUMENTS

EP 135366 A1 * 3/1985

*Primary Examiner* — Bernard E Souw
*Assistant Examiner* — Andrew Smyth
(74) *Attorney, Agent, or Firm* — Eschweiler & Associates, LLC

(57) ABSTRACT

A system and method extraction electrode system, comprising an extraction electrode, wherein the extraction electrode, further defines an aperture and forms a portion of the outside wall of the ion source and is configured to extract ions from the ion source, a suppression disk half assembly comprising two suppression electrode plate disk halves that form a variable suppression aperture, a ground disk half assembly comprising two ground electrode plate disk halves that form an variable ground aperture, wherein the suppression disk half assembly is configured between the extraction electrode and the ground disk half assembly, wherein the suppression aperture and the ground aperture variable in the direction perpendicular to the ion beam direction of travel, and wherein the extraction electrode system is used with a pendulum reciprocating drive apparatus.

20 Claims, 14 Drawing Sheets

U.S. PATENT DOCUMENTS

| | | | |
|---|---|---|---|
| 2005/0082498 A1* | 4/2005 | White | 250/492.21 |
| 2005/0173656 A1* | 8/2005 | Kaim et al. | 250/492.21 |
| 2005/0242293 A1* | 11/2005 | Benveniste | 250/396 R |
| 2006/0219938 A1* | 10/2006 | Huang | 250/432 R |
| 2007/0045557 A1* | 3/2007 | Angel et al. | 250/396 R |
| 2007/0176114 A1* | 8/2007 | Horsky et al. | 250/427 |
| 2007/0176115 A1* | 8/2007 | Horsky et al. | 250/427 |
| 2008/0067438 A1* | 3/2008 | Halling | 250/492.21 |
| 2008/0073559 A1* | 3/2008 | Horsky et al. | 250/428 |
| 2009/0166554 A1* | 7/2009 | Radovanov et al. | 250/424 |
| 2009/0261248 A1* | 10/2009 | Glavish et al. | 250/298 |

* cited by examiner

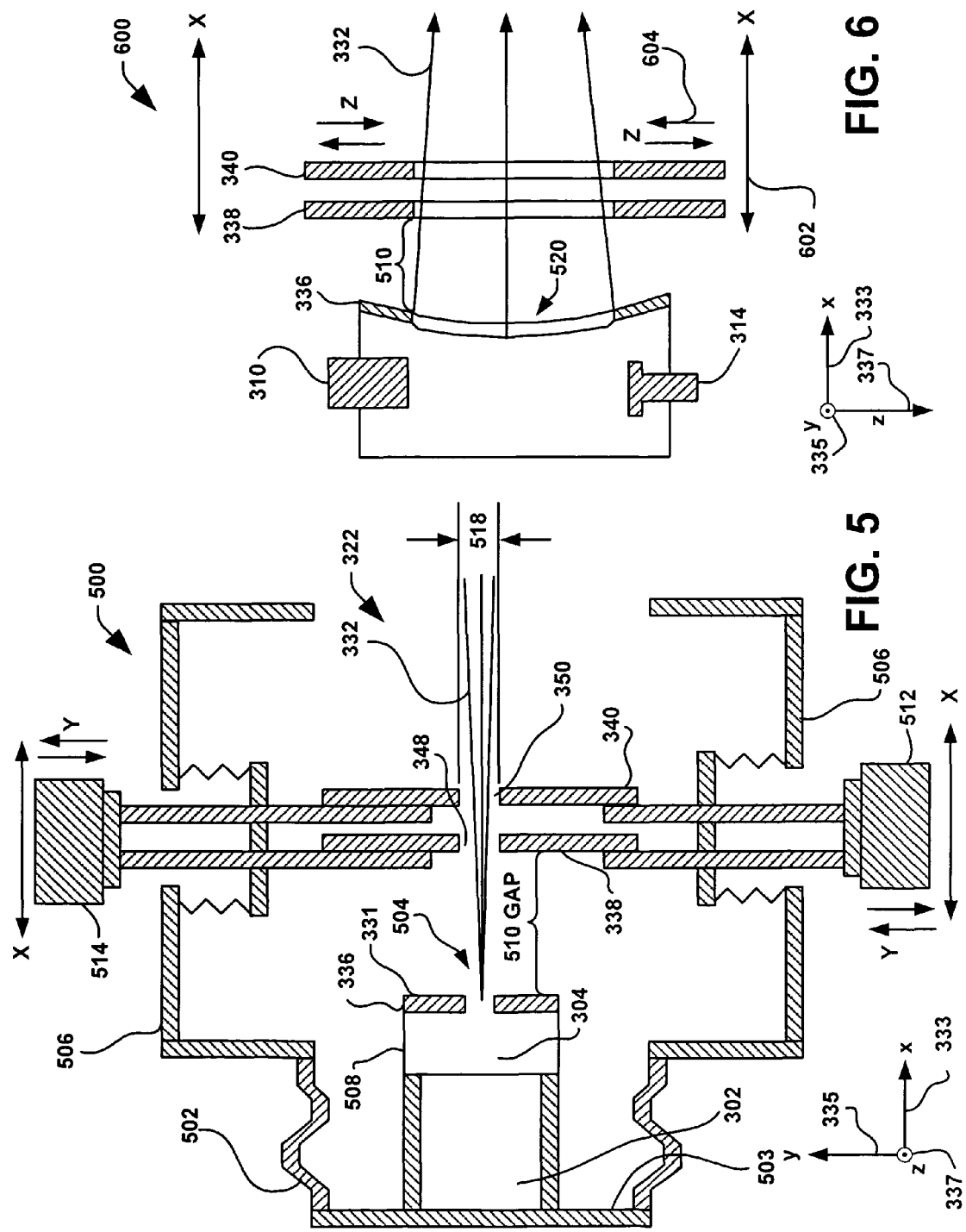

EXTRACTION ELECTRODE SYSTEM FOR HIGH CURRENT ION IMPLANTER

FIELD OF THE INVENTION

The present invention relates generally to ion implantation systems and more specifically to a system for utilizing an extraction electrode system with variable aperture electrodes and a variable gap for a high current ion implanter.

BACKGROUND OF THE INVENTION

In the manufacture of semiconductor devices and other ion related products, ion implantation systems are used to impart dopant elements into semiconductor wafers, display panels, or other types of workpieces. Typical ion implantation systems or ion implanters impact a workpiece with an ion beam utilizing a known recipe or process in order to produce n-type or p-type doped regions, or to form passivation layers in the workpiece. When used for doping semiconductors, the ion implantation system injects selected ion species to produce the desired extrinsic material. Typically, dopant atoms or molecules are ionized and isolated, sometimes accelerated or decelerated, formed into a beam, and implanted into a workpiece. The dopant ions physically bombard and enter the surface of the workpiece, and subsequently come to rest below the workpiece surface in the crystalline lattice structure thereof.

Referring initially to FIG. 1, illustrated is a prior art ion implantation system 100 that utilizes an extraction electrode system 200 similar to that of prior art FIG. 2. FIG. 1 illustrates a typical ion implantation system 100 that is operable to scan a workpiece 190 (e.g., a semiconductor substrate or wafer) relative to an ion beam, therein implanting ions into the workpiece 190. FIG. 2 represents a schematic of a prior art extraction electrode system 200 that utilizes a triode type extraction electrode system 200 for extracting an ion beam 30 from an ion source 20 for implantation.

The prior art system 100 (FIG. 1) includes modular gas boxes 164 and 166, and a gas box remote purge control panel 168. The gas boxes 164 and 166 comprise, among other things, one or more gases of a dopant substance, and the boxes 164, 166 facilitate selective delivery of the gas(es) into an ion source 182 within the system 100, wherein the gas(es) can be ionized to generate ions suitable for implantation into a wafer or workpiece 190 selectively brought into the system 100. The gas box remote control panel 168 facilitates venting or purging gas(es) or other substances out of the system 100 on an "as needed" or desired basis.

High voltage terminal power distribution 172 and a high voltage isolation transformer 174 are included to, among other things, electrically excite and impart energy to the dopant gas(es) to generate ions. An ion beam extraction assembly 176 is included to extract ions from the ion source 182 and accelerate them into a beamline region 178 illustrated by the bracket in FIG. 1, which includes a mass analysis magnet 180. The mass analysis magnet 180 is operable to sort out or reject ions of an inappropriate charge-to-mass ratio. In particular, the mass analysis magnet 180 comprises a guide having curved sidewalls into which ions of an undesired mass-to-charge ratio collide as they are propagated through the beamguide by way of one or more magnetic fields generated by magnet(s) of the mass analysis magnet 180.

A component 184 may be included to assist with controlling the angle of the scanned ion beam. This may include, among other things, a scan angle correction lens. An acceleration/deceleration column 186 facilitates controlling and adjusting the speed, and/or focusing, of ions within the ion beam. A component 188 operable to filter out contaminant particles, such as a final energy filter is also included to mitigate energy contaminating particles from encountering the workpiece 190.

Wafers and/or workpieces 190 are loaded into an end station chamber 192 for selective implantation with ions. A mechanical scan drive 194 maneuvers the workpieces 190 within the chamber 192 to facilitate selective encounters with the ion beam. The wafers or workpieces 190 are moved into the end station chamber 192 by a workpiece handling system 196, which may include, for example, one or more mechanical or robotic arms 197. An operator console 198 allows an operator to regulate the implantation process by selectively controlling one or more components of the system 100. Finally, a power distribution box 199 is included to provide power to the overall system 100.

Referring again to prior art FIG. 2, the ion source 20 and the extraction electrodes are illustrated schematically as a cross sectional side view which utilize a triode extraction assembly, as disclosed in U.S. Pat. No. 6,501,078. The ion source 20 comprises an arc chamber 20A mounted to a housing 15. A bushing 20B acts as an insulator to isolate the ion source 20 from the remainder of the housing 15. Ions formed in the arc chamber 20A are extracted from the source 20 through an exit aperture 21 in a front face 22 of the source 20. The front face 22 of the ion source 20 forms a first apertured source electrode at the potential of the ion source 20. The extraction electrodes are illustrated in FIG. 2 by suppression and ground apertured electrodes 24, 25 respectively. Each of the apertured electrodes 24, 25 comprise a single electrically conductive plate having an aperture through the plate to allow the ion beam emerging from the ion source 20 to pass through. Each aperture has an elongated slot configuration with the direction of elongation being perpendicular to the plane in FIG. 2. In other words the slot has its long dimension along the z axis, as shown, with the positive z axis going into the paper.

For a beam of positive ions, the ion source 20 is maintained by a voltage supply at a positive voltage relative to ground. The ground electrode 25 restricts the penetration of the electric fields between the ground electrode 25 and the ion source 20 into the region to the right (in FIG. 2) of the ground electrode 25.

The energy of the ion beam 30 emerging from the extraction assembly 200 is determined by the voltage supplied to the ion source 20. A typical value for this voltage is 20 kV, providing extracted beam energy of 20 keV. However, extracted beam energies of 80 keV and higher, or 0.5 keV or lower may also be obtained. To obtain higher or lower beam energies, it is a matter of raising or lowering respectively the source voltage.

The suppression electrode 24 is biased by a voltage supply to a negative potential relative to ground. The negatively biased suppression electrode 24, operates to prevent electrons in the ion beam downstream of the ground electrode 25 (to the right in FIG. 2) from being drawn into the extraction region and into the ion source 20. The suppression and ground electrodes 24, 25 are mounted so as to be movable relatively to the source 20 in the direction of travel of the ion beam 30 as indicated by the arrow x. The apparatus can be "tuned" such that the gap between the extraction and suppression 24 electrodes is larger when the beam energy is larger. The electrodes are further mounted, such that the suppression 24 and ground 25 electrodes are relatively movable laterally in the direction of arrow y, namely in the plane of the paper and approximately perpendicular to the ion beam direction, relative to the source 20. A mechanism is also provided by virtue of which the size of the electrode slit can be adjusted in the lateral direction y as indicated by the y arrows in FIG. 2.

It is an object of the present invention, then to provide an improved variable aperture electrode (VAE) with a variable gap electrode (VGE) that utilizes a pendulum scanning system in a high current ion implantation system. It is a further object to provide an acceleration/deceleration system for use in a high energy ion implantation system that utilizes a pendulum scanning device.

SUMMARY OF THE INVENTION

The present invention overcomes the limitations of the prior art by providing a system for an efficient extraction electrode system for a high current ion implanter. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an ion extraction electrode system for an ion implantation system, wherein the suppression and ground apertures can be adjusted, and the gap between the extraction electrode and the suppression electrode can be adjusted, and an acceleration/de-acceleration system for use in an ion implantation system that incorporates a pendulum scanning system.

According to one exemplary aspect of the invention, an extraction electrode system, comprising an extraction electrode, wherein the extraction electrode, further defines an aperture and forms a portion of the outside wall of the ion source and is configured to extract ions from the ion source, a suppression disk half assembly comprising two suppression electrode plate disk halves that form a variable suppression aperture, a ground disk half assembly comprising two ground electrode plate disk halves that form an variable ground aperture, wherein the suppression disk half assembly is configured between the extraction electrode and the ground disk half assembly, wherein the suppression aperture and the ground aperture variable in the direction perpendicular to the ion beam direction of travel, and wherein the extraction electrode system is used with a pendulum reciprocating drive apparatus.

According to another exemplary aspect of the invention an ion implantation system that utilizes a pendulum scanning system, the ion source comprising an arc chamber having an interior region area, an extraction electrode assembly comprising an extraction electrode, a variable aperture suppression electrode and a variable aperture ground electrode, wherein the extraction electrode generally encloses a portion of the interior region area of the arc chamber and further defines an extraction aperture for extracting ions from the ion source, wherein the extraction aperture, the variable suppression aperture and the variable ground aperture provide fluid communication between the interior region area of the arc chamber and a beamline assembly, wherein a gap between the extraction electrode and the suppression electrode is adjustable in the direction of the ion beam, and wherein the suppression aperture and the ground aperture are variable in a direction perpendicular to the direction of the ion beam.

According to yet another exemplary aspect of the invention an ion implantation system, comprising, (a) an ion source from which an ion beam is extracted, (b) an extraction electrode system comprising an extraction electrode for extracting ions from the ion source, a variable aperture suppression electrode and a variable aperture ground electrode, (c) a beamline assembly configured with a mass analysis magnet for mass analyzing the extracted ion beam along a beam path, (d) an acceleration/deceleration device configured to provide a acceleration or deacceleration bias to the ions to impart the desired implantation energy, and (e) a scanning system configured to reciprocate a workpiece using a pendulum reciprocating drive apparatus through the ion beam.

According to another example, a method for performing ion implantation, comprising generating (a) measuring ion beam current at implant location, (b) comparing measured beam current with specified beam current, (c) determining if the measured beam current is within specification, (d) returning to (a) if the measured beam current is within specification, else going to (e), (e) determining the necessary correction factors based upon the measured beam current, (f) adjusting a gap between extraction electrode and suppression disk half assembly, and a suppression aperture and a ground aperture width based upon correction factor, and (g) go to end.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 5 illustrates a cross-sectional schematic of an ion source extraction apparatus according to another aspect of the present invention;

FIG. 6 is a perspective view of electrodes according to yet another exemplary aspect of the invention;

DETAILED DESCRIPTION OF THE INVENTION

Figure 1:
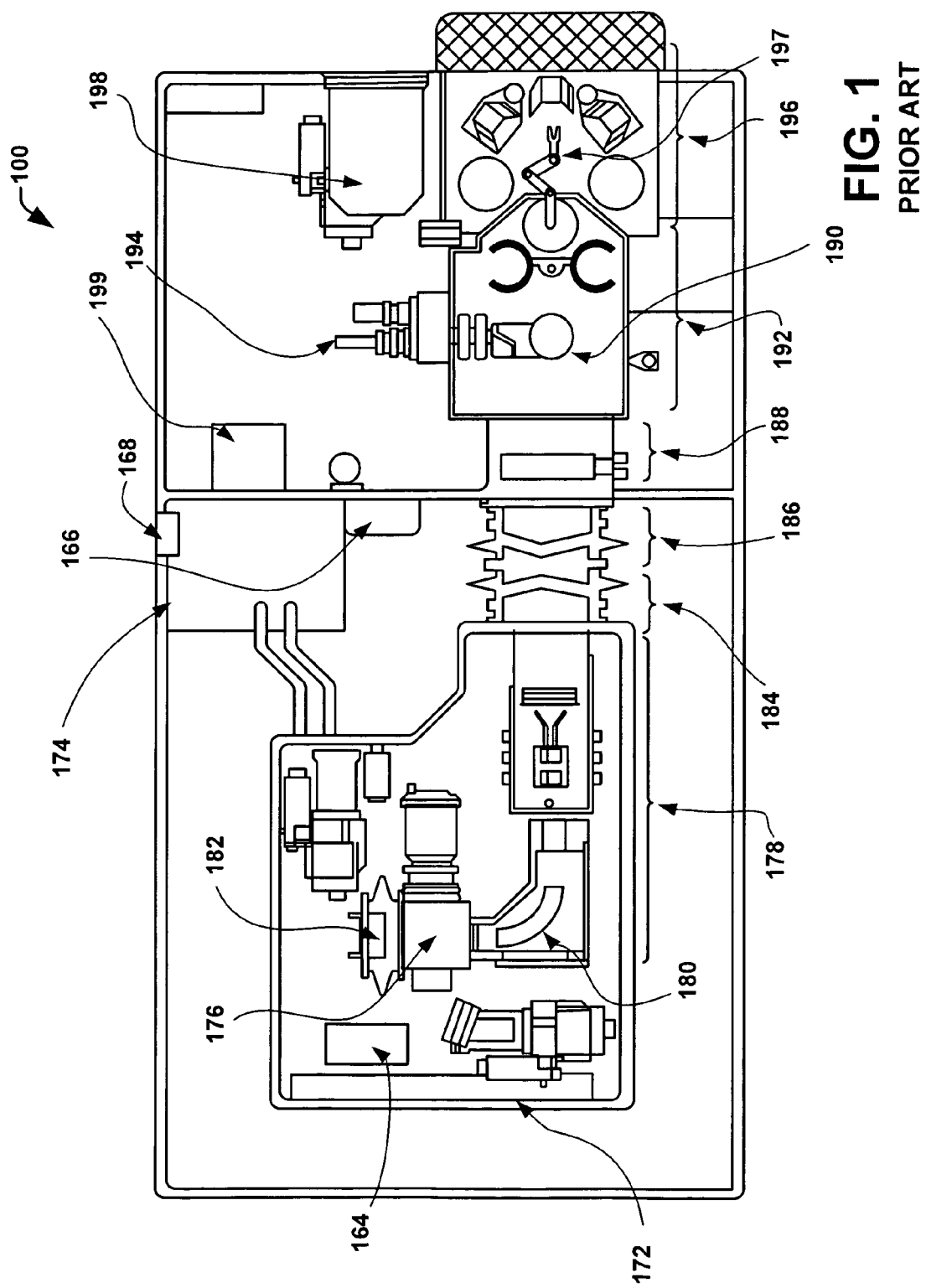
FIG. 1 illustrates a prior art system-level view of an exemplary ion implantation system.
Figure 2:
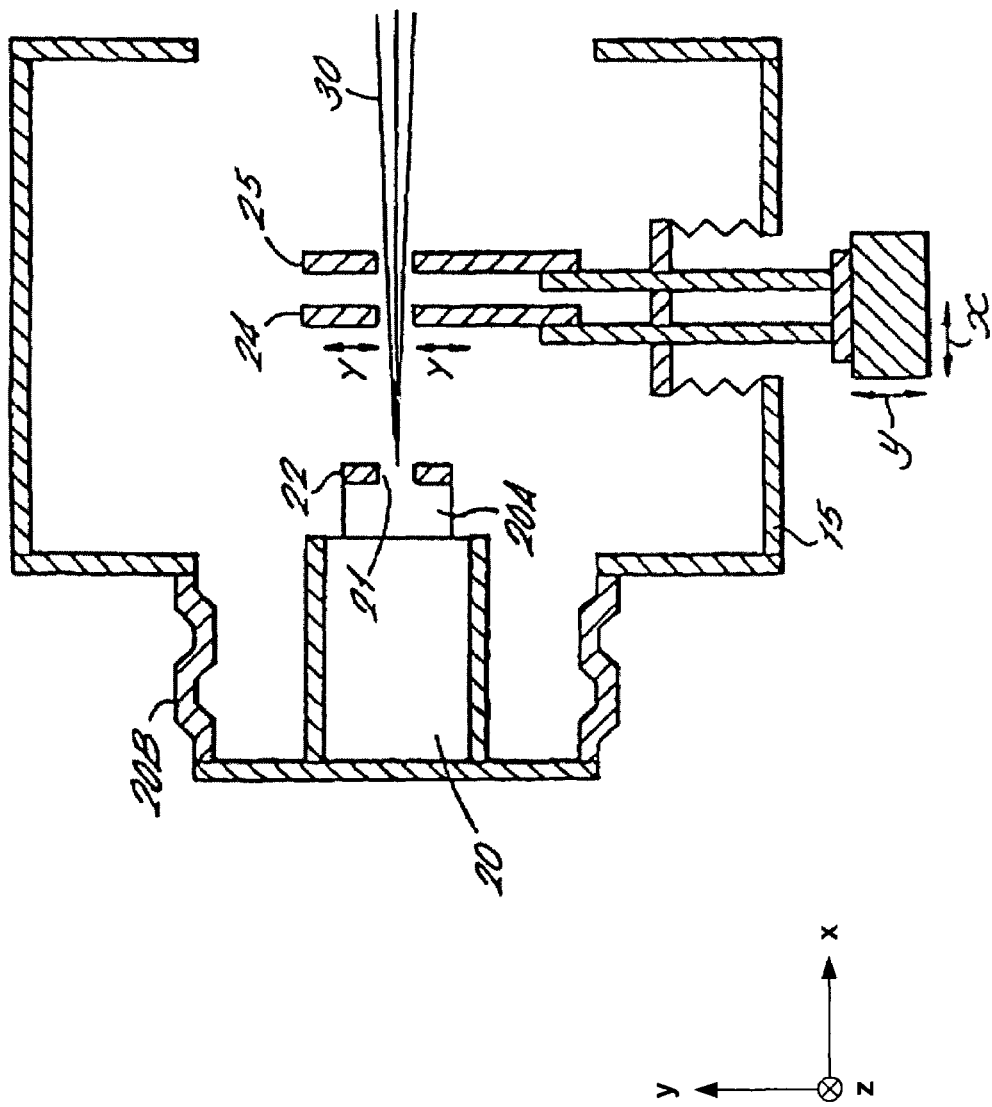
FIG. 2 is a schematic of a prior art ion source extraction apparatus.

The present invention is directed generally towards an improved ion extraction electrode system and method used in an ion implantation system that utilizes a pendulum reciprocating drive apparatus. More particularly, the system and method efficiently extract ions utilized in the ion implantation system. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 3:
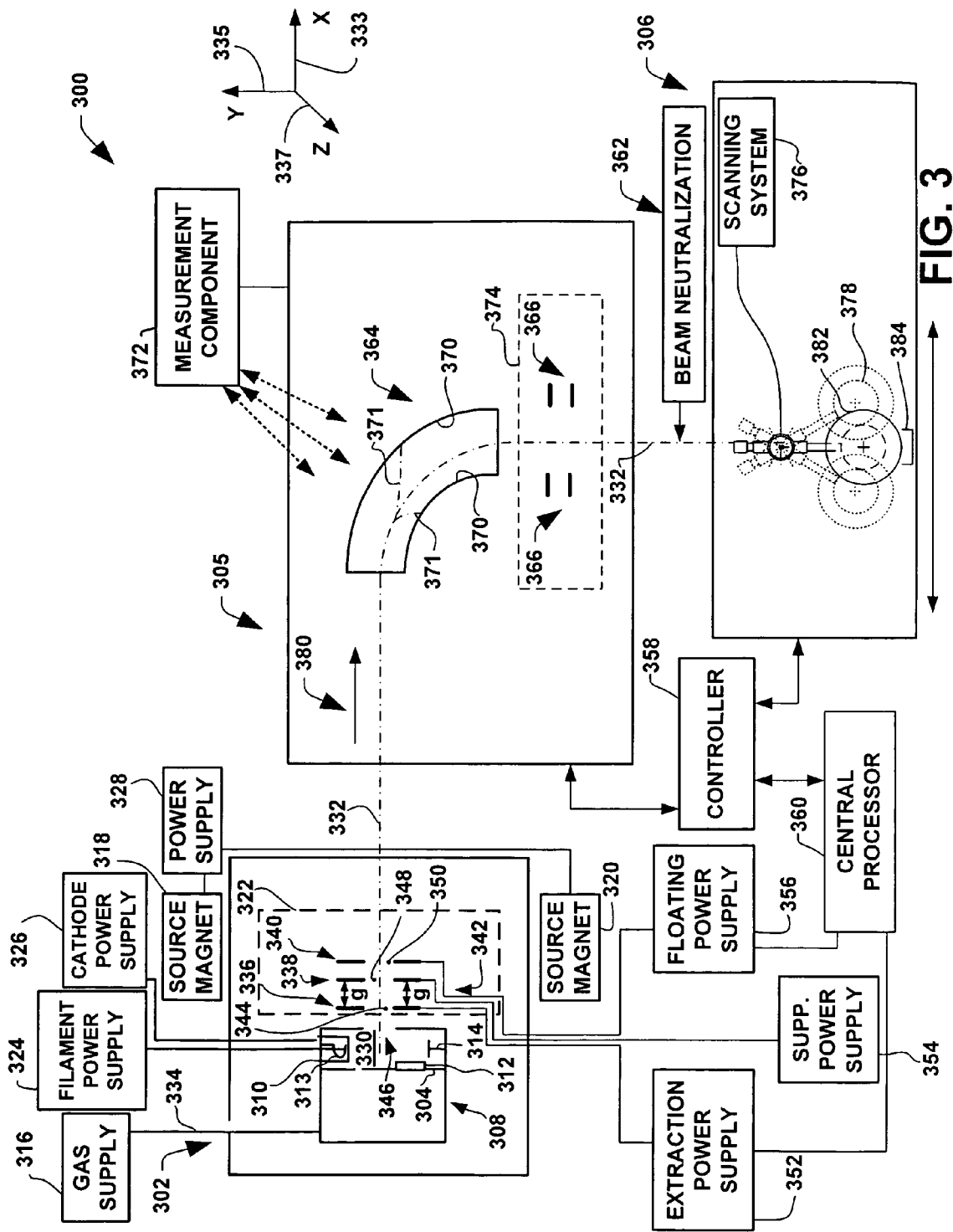
FIG. 3 illustrates an ion implantation system according to an aspect of the present invention.

Turning now to FIG. 3, the drawing illustrates, in a simplified schematic block diagram form, certain components of an exemplary high-dose ion implantation system 300 wherein one or more aspects of the present invention are implemented. The system 300 is illustrated for producing an ion beam 332 in the range of 0.5 to 60 keV, for example. The system 300 includes an ion source 302, a beamline assembly 305, and an end station 306. In the example shown, the ion source 302 comprises an plasma generating component 308, a cathode 310, a filament 313, an anode 312, a repeller 314, a gas supply 316, source magnet components 318 and 320, and an ion extraction/suppression) electrode assembly 322. A dopant gas can, for example, be fed into the chamber 304 from a gas source 316 through a conduit 334. A filament power supply 324 and a cathode voltage supply 326 are operatively coupled to a filament 313 and the cathode 310 respectively; and another power supply 328 is connected to the source magnet components 318, 320 in the example shown.

In operation, the gas supply 316 provides one or more precursor gases (e.g., via the conduit 334) into an area 330 of the ion source 302 wherein the ions are generated. The cathode 310, in one example, includes the filament 313 (e.g., a rod made of tungsten or tungsten alloy) which can be heated by the filament power supply 324 (e.g., to about 2500 degrees Kelvin) to excite electrons therein to collide with dopant gas molecules. The cathode voltage supply 326 can, in turn, provide additional energy to the cathode 310 (e.g., to heat the cathode 310 to about 2500 degrees Kelvin) to cause electrons to jump from the cathode 310 into the area 330 wherein the gas is situated. The anode 312 assists with drawing the electrons into the area 330, and may include sidewalls of the ion source 302, for example. Further, a power supply (not shown) may also be coupled to the anode 312 so that a bias can be set up between the cathode 310 and the anode 312 to facilitate drawing additional electrons into the area 330, for example.

The repeller 314 can also assist with maintaining the electrons within the area 330. In particular, a bias imparted to the mirror electrode repeller 314 serves to repel electrons emitted from the cathode 310 back into the area 330. Similarly, a magnetic field induced within the ion source 302 by the source magnet 318 and 320 serve to maintain electrons within the area 330 and off of sidewalls of the source 302. In the example shown, two source magnet components 318 and 320 of the source magnet are shown. These may be indicative, of a cross-sectional view of windings and/or a yoke of an electromagnet, for example. The electrons moving around within the area 330 collide with the gaseous molecules within the area 330 to create the ions. In particular, electrons that collide with gaseous molecules with sufficient force cause one or more electrons to become dislodged from the molecules, thus producing positively charged gaseous ions. It will be appreciated that the magnetic field applied by the source magnet components 318 and 320 may be perpendicular to the cathode 310 in a y direction 335 to increase the electron path length and to assist with suspending plasma of both the ions and the electrons within the area 330.

It will be further appreciated that the present invention contemplates and has application that can utilize negatively charged ions, as well. Additionally, it will also be appreciated that the beam current density or intensity is related to the number of ions produced within the ion source 302. Thus, in accordance with one or more aspects of the present invention, any one or more of the components of the ion source 302 can be selectively adjusted to modulate the beam current. By way of example only and not limitation, the magnetic field set up by the source magnet components 318 and 320 can be altered by controlling the power supply 328 to increase or retard the number of ions generated within the source 302 to correspondingly increase or decrease the beam current.

It will be further appreciated that the present invention contemplates and has application to ion sources of types other than the arc discharge source described above. For example, an ion source may include a means of RF excitation to produce ions. Such a source is disclosed in U.S. Pat. No. 5,661,308, the entirety of which is hereby incorporated by reference. An additional example is an ion source that may include a means of excitation by electron beam injection to produce ions. This is sometimes referred to as a "soft ionization" type of source. An example of such a source is disclosed in U.S. Pat. No. 6,452,338, the entirety of which is also hereby incorporated by reference. An additional example of an ion source to which the present invention has application is an ion source that includes a means of microwave excitation to produce a plurality of ions.

The ion beam 332 (e.g., simply illustrated as a single dashed line) is extracted from the ion source 302 by an extraction electrode 336 which is generally biased negatively with respect to the ion source 302, thereby attracting positive ions. A suppression electrode 338 serves the function of providing suppression of electrons which are attracted toward the ion source 302 by its generally positive bias. Further on in a positive x direction 333, the beam 332 encounters a ground electrode 340. In one or more embodiments a gap 342 between the fixed extraction electrode 336 and the movable suppression electrode 338 and a ground electrode 340, can be adjusted.

In this embodiment the size of the gap (g) 342 can be increased for higher energy beams and decreased for lower energy beams, for example. Therefore, by adjusting the gap 342 between the extraction electrode 336 and the suppression electrode 338, the electric field can be adjusted to avoid and/or reduce arc discharges, thus allowing the ion implantation system 300 to be operated at higher beam currents than can typically be realized over a wider energy range (e.g., 0.5 to 80 keV). In contrast, at low beam energies, space charge repulsion can be reduced by decreasing the gap 342. In addition, the ability to adjust the gap 342 allows greater focus and control of the ion beam 332.

The extraction electrode 336 can comprise a single plate with an extraction aperture 344 formed therein, disposed opposite and in-line with an ion source exit aperture 346. The extraction electrode 336 is adjustably spaced from the suppression electrode 338 having a variable suppression aperture 348, by a distance referred to as the extraction gap (g) 342, as discussed supra. The suppression electrode 338 and the ground electrode 340 can each further comprise two or more separate plates (not shown), for adjusting the variable suppression and ground aperture, 348 and 350, respectively, also known by those of skill in the art as variable aperture electrode (VAE). The ground electrode 340 having the variable ground aperture 350 formed therein, is positioned on the other side of the suppression electrode 338, as illustrated, and can be fixedly spaced from the suppression electrode 338, for example.

Both the suppression electrode 338 and the ground electrode 340 can be adjustable so that the apertures 348 and 350 can be aligned to the extraction aperture 344 in the y-direction 335. In the alternative, the extraction aperture 344 and suppression aperture 348 can only be aligned during setup. However, it is to be appreciated by one skilled in the art that a mechanism can be utilized as an active control over all of the apertures in the y-axis direction 335.

The extraction electrode 336, the suppression electrode 338 and the ground electrode 340 are electrically insulated from each other and each is connected to a separate voltage sources 352, 354 and 356, respectively. Each of the voltage sources 352, 354 and 356 and a controller 358 are connected to a central processor 360 which generates control signals for controlling the potential on each of the electrodes 336, 338 and 340, an ion source arc chamber 304, and the gap 342. Thus, the measured ion energy can be used in a feedback loop to control parameters in ion generation, such as: the gap 342, aperture width/size adjustment, aperture alignment, the potential applied to the electrodes (336, 338 and 340), etc. The processor 360 can generate a control signal for controlling the ion beam extraction parameters depending on the measured energy, for example.

The ion beam 332 then enters the beamline assembly 305 and an associated analyzer magnet 364. The mass analysis magnet 364 can be formed at about a ninety degree angle and a magnetic field is generated therein. As the ion beam 332 enters the magnet 364, it is correspondingly bent by the magnetic field such that ions of an inappropriate charge-to-mass ratio are rejected. More particularly, ions having too great or too small of a charge-to-mass ratio are deflected 371 into side walls 370 of the magnet 364. In this manner, the magnet 364 only allows those ions to remain in the beam 332 which have the desired charge-to-mass ratio to completely traverse therethrough.

The control electronics or the controller 358 can adjust the strength and orientation of the magnetic field, among other properties. The magnetic field can, for example, be controlled by regulating the amount of electrical current running through field windings of the magnet 364. It will be appreciated that the controller 358 may include a programmable micro-controller, processor and/or other type of computing mechanism for overall control of the system 300 (e.g., by an operator, by previously and/or presently acquired data and/or programs).

The beamline assembly 305 may also include an accelerator/decelerator 374, for example, that comprises a plurality of electrodes 366 arranged and biased to accelerate and/or decelerate ions, as well as to focus, bend and/or decontaminate the ion beam 332. The electrodes 366 decontaminate the beam 332 by bending the beam 332 and separating out contaminating particles from the beam 332, in a manner discussed in further detail below.

Further, it will be appreciated that ion beam collisions with other particles degrade beam integrity, so that an entire beamline assembly 305, from the source 302 to the end station 306, may be evacuated by one or more pumps (not shown). Downstream of the accelerator/decelerator 374 is the end station 306 which receives the mass analyzed ion beam 332 from the beamline assembly 305. The end station 306 includes a scanning system 376 (See details in FIG. 4) that may comprise a support or end effector 378 upon which a workpiece 382 is mounted for selective movement thereby. The end effector 378 and the workpiece 382 reside in a target plane that is generally perpendicular (i.e., the xz plane) to the negative y direction of the ion beam 332.

It will be appreciated that the beam current may be affected by many of the components of the system 300. For example, respective biases on the extraction electrode 336, the suppression electrode(s) 338, the ground electrode(s) 340, and electrodes 366 can affect the beam current. Accordingly, the beam current can be modulated by selectively controlling one or more of the extraction and the suppression voltage supplies, 352 and 354, respectively. The floating ground supply 356, supply 328, supply 324 and supply 326 control the respective voltages applied to various components. It will be appreciated that while a combined set of the extraction electrode 336 and the suppression electrode 338 are discussed herein, the present invention contemplates separate sets of the extraction electrode 336 and suppression 338 electrodes having respective supplies that can be independently varied to alter the respective voltages applied to those electrodes. It will be further appreciated that the ground electrode 340 is generally modulated with a voltage different from the other electrodes 336 and 338, equal to or different from the ground potential.

The foregoing voltage supplies can be controlled by another controller, for example, that takes readings from a measurement system 372 (e.g., that includes a Faraday cup 384) indicative of the end of scan beam current utilized during ion implantation, for example. Similarly, the controller 358 can be operatively coupled to the beam neutralization system 362 to modulate the beam current by selectively regulating the amount of active plasma to which the ion beam 332 is subjected. Modulating the beam current via the source of plasma may be more effective at lower energies (e.g., less than about 3 keV) since active plasma neutralization is typically not required for efficient beam transport at higher energies. It will be appreciated that the controller 358 may also assist (e.g., the measurement system 368) in developing implantation waveforms as previously discussed, and may make use of such waveforms in facilitating selective adjustments to the ion beam current.

The following paragraph may be removed if you want, not sure you are talking about the modulation the scanner of the FIG. 1 or something else.

Figure 4:
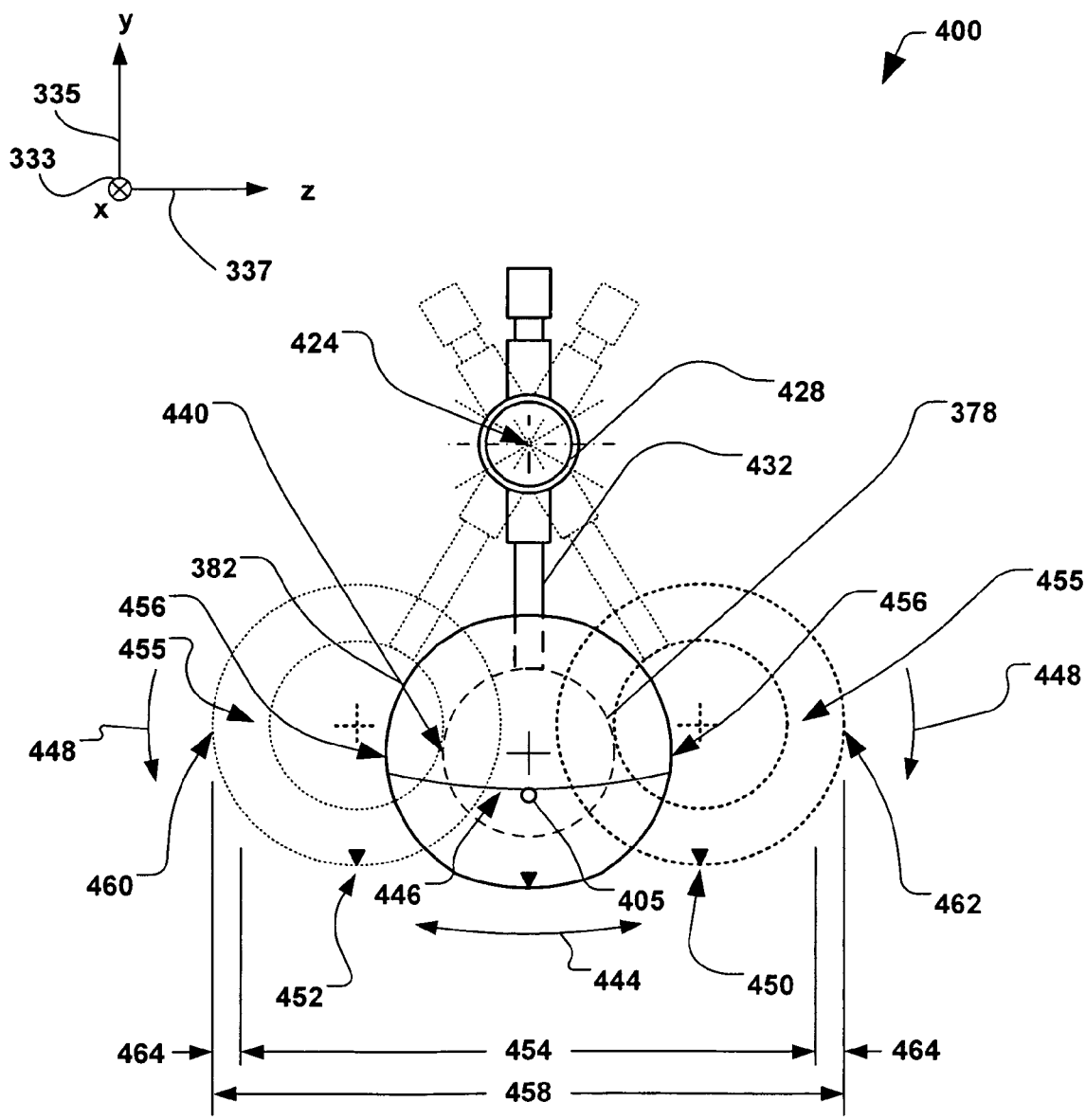
FIG. 4 is a simplified front view of an exemplary reciprocating drive apparatus according to one aspect of the present invention.

Referring now to FIG. 4, illustrated is an exemplary pendulum reciprocating drive apparatus 400, wherein an exemplary rotation 444 of a shaft 428 about a first axis 424, wherein a scan arm 432, an end effector 378, and a workpiece 382 are further rotated about the first axis 424. Accordingly, the workpiece 382 can be reciprocally translated along a first scan path 446 with respect to an ion beam 405 (e.g., via one or more cyclical counter-rotations of the shaft 428 about the first axis 424), wherein the ion beam 405 is illustrated as going into the page of FIG. 4. The rotation 444 (and/or counter-rotation) of the shaft 428 about the first axis 424 can be advantageously controlled in order to oscillate or reciprocate an end effector 378 along the first scan path 446 in a uniform manner, as will be discussed hereafter. FIG. 4 further illustrates a counter-rotation 448 of the end effector 378 about a second axis 440 as discussed above, wherein the rotation of the end effector 378, and hence, the workpiece 382, about the second axis 440 can be further controlled in order to maintain a rotational orientation, e.g., the line connecting the effector center second axis 440 and a given location 450 on the workpiece 382 to be parallel at different positions of the rotation, as shown, for example, with respect to the first axis 424 or ion beam 405 (e.g., rotational orientation of the workpiece 382 with respect to the ion beam 405 extraction electrode 336 is indicated by a triangle 452 that is fixed with respect to the workpiece 382).

In order to evenly process the workpiece 382, such as providing an even implantation of ions into the workpiece 382 from the ion beam 405, it is important to maintain a generally constant translational velocity of the end effector 378 while traveling along the first scan path 446. Maintaining an approximately constant velocity of the end effector 378 while the workpiece 382 passes through the ion beam 405, for example, provides a generally uniform dose of ions to the workpiece 382. Thus even processing of the workpiece 382 is accomplished as it travels along the first scan path 446 in a pendulum-type motion.

Referring now to FIGS. 5 and 6 of the present invention, an extraction electrode assembly 500 and 600 for an ion implantation system (e.g., FIG. 3) is illustrated as a schematic cross-sectional side view of a mechanical construction. An ion source 302 comprises an arc chamber 304 and can be fixably attached to an ion source housing 506 and is more fully described with reference to FIG. 7. A bushing 502 is illustrated that operates as an insulator to isolate the ion source 302 mounted to a circular disk 503 from the rest of a housing 506. Ions formed in the arc chamber 304 are extracted from the source 302 through an exit aperture 504 in a front face 331 of the ion source 302. The front face 331 of the arc chamber 304 forms an extraction electrode 336, for example. The extraction electrode assembly 322 illustrated in FIG. 5, comprises an extraction electrode 336, a suppression variable aperture electrode 338 and a variable aperture ground electrode 340, shown in greater detail in FIG. 6. The variable apertured electrodes, 338 and 340 each can comprise two separate electrically conductive plate(s) that together form an aperture (i.e., 348 and 350) to allow the ion beam 332 emerging from the ion source 302 to pass throughwith. A first and second mechanism 512 and 514 are designed to move the suppression and ground electrodes, 338 and 340, both of which are mounted in the electrode housing 506, so as to be movable together, in the x and y directions. Each variable aperture 348 and 350 has an elongated slot configuration, with the direction of the elongation being perpendicular to the plane of the paper in FIG. 5 and in the plane of the paper in FIG. 6 or the z direction 337. Note that the circle with the black center next to the z represents an arrow coming out of the paper in the positive z direction. The mechanisms, 512 and 514, adjust the aperture opening 518 (i.e., 348 and 350) when the mechanisms, 512 and 514, are moved in the y direction, and the gap 510 is adjusted when the mechanisms, 512 and 514, are moved in the x direction.

For creating a beam 332 of positive ions, the ion source 302 can be maintained by a voltage supply at a positive voltage relative to ground. The variable aperture ground electrode 340 acts to restrict the penetration of the electric fields between the ground electrode 340 and the ion source 302 into the region to the right (e.g., as illustrated in FIG. 5) of the ground electrode 340. The energy of the ion beam 332 emerging from the extraction assembly 500 is determined by the voltage supplied to the ion source 302. A typical value for this voltage is 20 kV, providing "extracted beam energy" of approximately 20 keV. However, extracted beam energies of 80 keV and higher, or 0.5 keV or lower energies are contemplated herein. To obtain higher or lower beam energies, is a matter of raising or lowering respectively the source voltage.

The suppression electrode 338 can be biased by a voltage supply to a negative potential relative to ground. The negatively biased suppression electrode 338 operates to prevent electrons in the ion beam 332 downstream of the ground electrode 340 (to the right in FIG. 5) from being drawn into the extraction region and into the ion source 302. The extraction electrode 336 can be curved in the plane of the paper, as illustrated in FIG. 6 so as to be concave 520 facing away from the source 302. The degree of curvature is sufficient to suppress any divergence of the beam 332 in the direction parallel to the plane of the paper on FIG. 6.

The suppression 338 and ground 340 electrodes are mounted as shown in FIG. 5 so as to be moveable in the beam 332 x direction 333 allowing the gap 510 to be adjusted to either increase or decrease the gap 510. The electrodes 338 and 340 can be adjusted in the positive and negative y direction 335, as well. The suppression electrode 338 and the ground electrode 340 are fixedly attached, for example, to a mechanism 512 to be movable relative to the extraction electrode 336 in the direction of travel of the ion beam 332. The extraction electrode system 500 can be "tuned" to either increase or decrease the gap 510 between the extraction and suppression electrodes 336 and 338. The larger the beam energy desired, for example, the larger the gap 510 that can to be set within the system 500. The suppression electrode 338 half plates (i.e., two half plates) and the ground electrode 340 half plates can be movable in the y direction 335 to either increase or decrease the aperture opening 518. The inventors recognized that by allowing the gap 510 to be adjusted but not the aperture openings of both the suppression electrode 338 and the ground electrode 340 that the loading on the suppression electrodes can be too high, and the focusing property of the electrode system is not adequate when the gap is large.

The extraction electrode 336 can be curved in the plane of the paper of FIG. 6, for example, so that it is concave 520 facing away from the ion source 302. The degree of curvature can be designed so that the extraction electrode 336 suppresses any divergence of the ion beam 332 in the direction parallel to the plane of the paper on FIG. 5.

Figure 7:
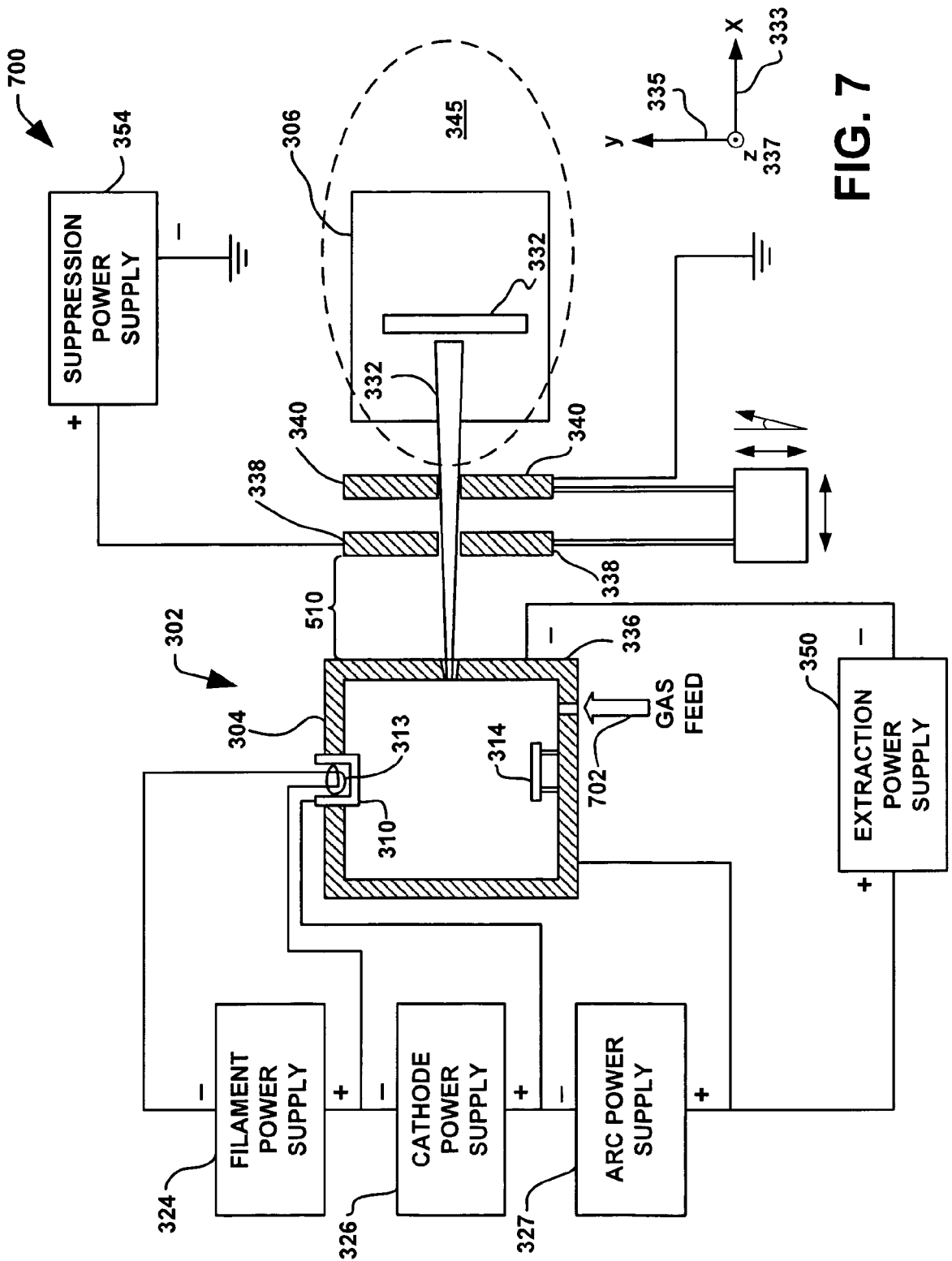
FIG. 7 illustrates a simplified electrical schematic of an extraction electrode system according to another aspect of the present invention.

Referring to FIG. 7, illustrated is a cross-sectional ion extraction electrode system 700 used in the present invention in high current, high energy, and medium current ion implanters according to one or more embodiments of the present invention. FIG. 7 illustrates one or more embodiments of a biasing scheme of power supplies which provide various voltages to components of the electron extraction system 700 and to an ion source 302, for example. The extraction electrode system 700 is mounted within the vacuum system of an ion implanter through a mounting flange which also accommodates vacuum lines for cooling water, thermocouples, dopant gas input lines, cooling gas lines, etc. The dopant gas feed 702 allows gas to be introduced into the arc chamber 304 in which the gas is ionized. Water cooling can be provided to limit the temperature extremes of the arc chamber 304 which can operate between 700 C and 800 C, for example. The ion source 302 in this embodiment acts as an arc discharge source operating by sustaining a continuous arc discharge between a filament 313 indirectly heated cathode 310 and the internal walls of the arc chamber 304.

The gas introduced into the arc chamber 304 is ionized through impacting the energized electrons discharged between the cathode 310 and the arc chamber 304. Source magnet components can increase the ionization efficiency of the arc chamber 304 by providing magnetic fields. A repeller 314, located within the arc chamber 304 illustrated at the end opposite the cathode 310 is typically held at the same electrical potential as the cathode 310, and serves to repel or reflect the electrons confined by the magnetic field created by the source magnet components or source magnets back toward the cathode 310 (e.g., moving back and forth repeatedly). This allows for the production of a high current density of extracted ions. The indirectly heated cathode 310 emits electrons when heated by the filament 313 powered by the external filament power supply 324, for example. The filament power supply ($V_F$) 324 can supply power and current to the filament 313 of 10 volts and 60 amps, for example. The cathode 310 and the repeller 314 are typically held at a voltage between 0 V and 600 V below the potential of the arc chamber 304 by a cathode power supply ($V_C$) 326 and an arc chamber power supply ($V_A$) 327. It should be appreciated that the heating can be done either directly or indirectly or as an alternate embodiment can be microwave heating, RF heating, etc. The arc chamber power is supplied by the arc chamber power supply 327 at approximately 150 volts and 7 amps, for example. This provides a bias of the arc chamber 304 relative to ground voltage.

The extraction electrode system 700 also includes an extraction electrode 336, which is mounted and can form the face plate front face 331 to extract ions formed within the ion source in order to form of an ion beam 332. The ion source 302 can be held at the potential of extraction power supply 350.

Figure 8:
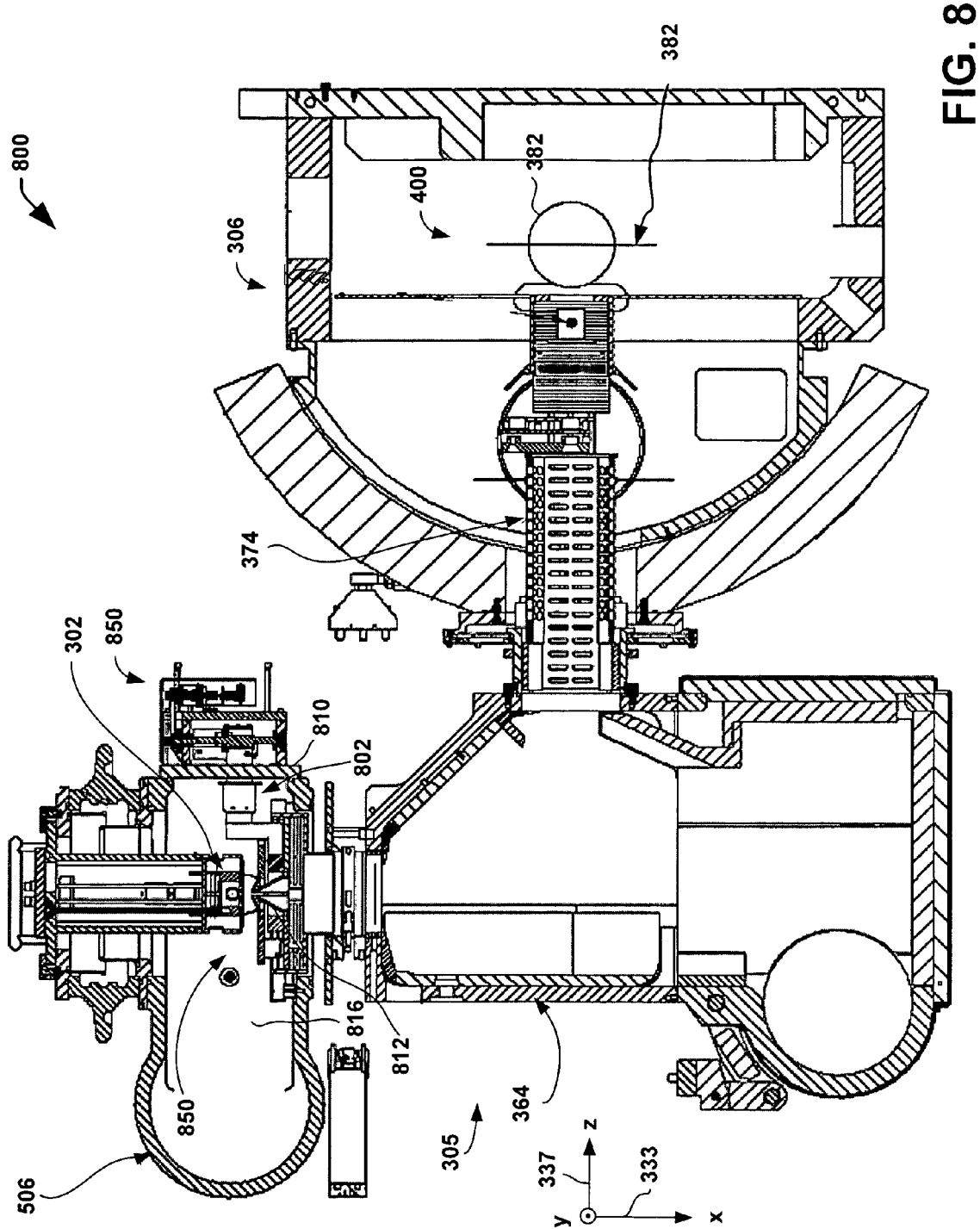
FIG. 8 is a cross-sectional view of a high dose ion implantation system according to yet another aspect of the present invention.
Figure 9:
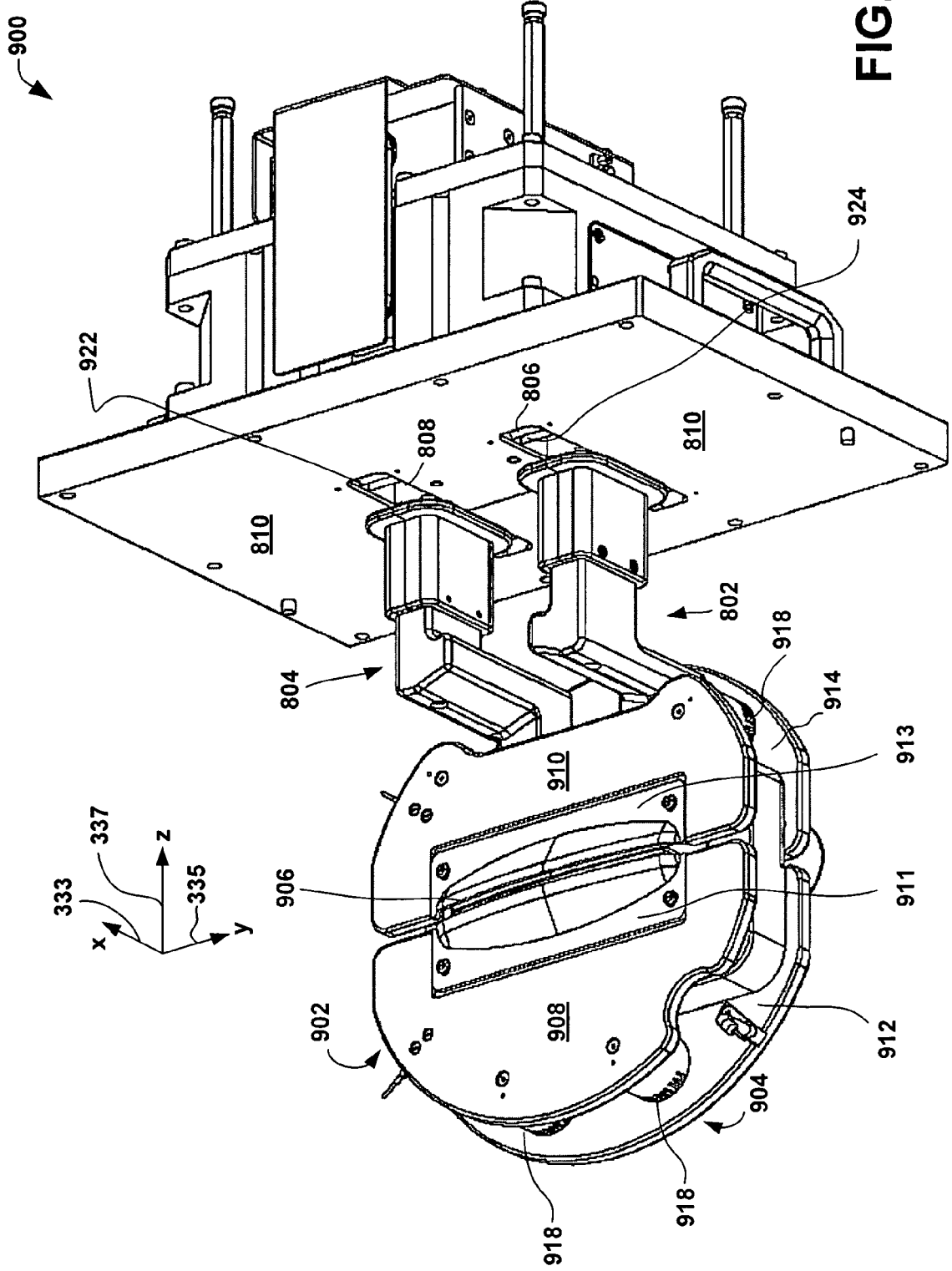
FIG. 9 is a perspective view of an electrode manipulator according to another exemplary aspect of the invention.

Now turning to FIGS. 8-9, illustrated in FIG. 8 is a cross-sectional plan view of an exemplary high-dose ion implantation system 800 that makes use of an extraction electrode system 850 according to one or more aspects of the present invention. The implantation system 800 comprises multiple subsystems: including an ion source 302 for producing an ion beam 332 (FIG. 3), a beamline assembly 305 including a mass analysis magnet for mass analyzing the ion beam, a beam tunnel accelerator/de-accelerator 374 and an end station 306 which contains a pendulum reciprocating drive apparatus 400 (FIG. 4) for reciprocating the workpiece 382 through the stationary ion beam, for example.

As discussed supra, ions are generated in the arc chamber 304 (FIG. 3) of a Freeman or Bernas type ion source 302. The extraction electrode system 850 can comprise an extraction electrode 336, a suppression electrode 338 and a ground electrode 340 (FIG. 7). The extraction electrode 336 (FIG. 7) in this embodiment is located at the front face of the ion source 302 in order to control the shape and direction of the ion beam (i.e., acceleration and focus). The extraction electrode 336 (FIG. 7) can be a single graphite plate with an opening or aperture 344 (FIG. 3). In this embodiment the extraction electrode 336 (FIG. 7) is fixedly attached to the source 302, however the extraction electrode 336 can be non-fixedly attached to or offset from the source 302 and is contemplated herein.

The suppression electrode 338 (FIG. 7) is positioned between the extraction electrode 336 (FIG. 7) and the ground electrode 340 (FIG. 7) and normally "acts" to suppress secondary electrons from back-streaming toward the source. In this embodiment, the suppression electrode 338 and the ground electrode 340 are fixedly attached to each other (as illustrated in the x direction 333 in FIG. 7) which will be described in further detail later in this disclosure.

To generate the ion beam 332, the ion source 302 can be voltage biased relative to the electrodes (i.e., 336, 338 and 340), and ions are extracted from the ion source 302 and accelerated towards the electrodes (i.e., 336, 338 and 340). In the arrangement shown, the forward ground electrode 340 furthest from the ion source 302 is maintained at ground potential, and the ion source 302 and the extraction electrode 336 are voltage biased positively and negatively, respectively, relative to ground. The suppression electrode 338 generally serves to prevent electrons in the space forward of the electrode assembly 322 (FIG. 3), which are required to neutralize the ion beam 332, from being swept backwards (to the left as illustrated in FIG. 7) to the ion source 302. The ion beam 302 can be "tuned" to the required energy and beam current by adjusting the voltage of the ion source 302 and the suppression electrode 338 and/or adjusting the size of the gap 510 between the extraction electrode 336 and the electrodes (338 and 340), by means of an actuator (not shown).

The ion beam 332 then proceeds to a beamline assembly 305 comprising a mass analyzing magnet 364. The atomic mass unit (AMU) analyzing magnet 364 functions to allow only the ions generated by the ion source 302 having an appropriate charge-to-mass ratio to continue in the ion beam 332. The AMU analyzing magnet 364 is required because the ion source 302, in addition to generating ions of appropriate charge-to-mass ratio, also generates undesirable ions of greater or lesser charge-to-mass ratio than specified. Ions having inappropriate charge-to-mass ratios are not suitable for implantation into the workpiece 382 and would reduce throughput of workpieces.

An extraction electrode system 850 that will be described in greater detail infra, comprises an electrode assembly chamber 816, a mounting plate 810, and a support leg assemblies 802 and 804 (not shown) for adjusting the apertures of the adjustable electrodes.

Turning now to FIGS. 9-13, illustrated are various perspective views and cross-sectional views of a variable aperture electrode (VAE) plate assembly; according to one or more embodiments of the present invention. The variable gap electrode (VGE) is disclosed in U.S. Pat. No. 5,420,415, the entirety of which is hereby incorporated by reference. Referring to FIG. 9, an electrode assembly 900 is comprised of two matching graphite disk half assemblies 902 and 904. The disk half assemblies 902 and 904 are assembled and aligned in a shared yz plane that is perpendicular to the predetermined beam path x and the assemblies are spaced apart to define an elongated gap 906 in which the ions exiting from the ion source 302 pass through. The extraction electrode can be precisely aligned with the predetermined ion beam path x.

The suppression disk half assembly 902 is comprised of suppression electrode plate disk halves 908 and 910, suppression plate replaceable edge insert pieces 911 and 913, whereas the ground disk half assembly 904 comprises plate disk halves 912 and 914, and ground plate disk half replaceable edge insert pieces 915 and 916. The disk half replaceable edge insert pieces 911, 913, 915 and 916 are secured to their respective disk halves 908, 910, 912 and 914 and together define the electrode gap 906. The insert pieces 911, 913, 915 and 916, are replaceable due to potential damage caused by the impact of accelerating ions and cut the cost of replacing components. The disk halves, 908, 910, 912 and 914 can be replaced as necessary.

The suppression electrode plate disk half 908 can be secured in a spaced apart relationship to the ground electrode plate disk half 912 using, for example, spring-loaded shoulder screws in conjunction with ceramic spacers suppression insulators 918 in between disk half 908 and 912 to provide the spaced apart, parallel relationship and electrical insulation.

Similarly, the suppression electrode plate disk half 910 is secured in a parallel, spaced apart relationship to the ground electrode plate disk half 914.

The assembly made up of plate disk halves 908 and 912 can be connected and supported by the support leg assembly 802. The connection is through screws connecting assembly 802 to 912, for example. Similarly assembly 910 and 914 can be supported by the leg 804, and the leg 804 is connected to the ground electrode plate disk half 914.

The movement of the two support leg assemblies 802 and 804 will move the assembly made up of plate disk halves 908 and 912 and the assembly 910 and 914. Thus, the gap 906 and the aperture can be adjusted.

The support leg assemblies 802 and 804 extend through slotted openings 806 and 808 in the support flange mounting plate 810. The spacing between the support leg assemblies 802 and 804 and the openings are covered by flexible ribbon bellows 922 and 924. The flexible bellows 912 and 914 are compressed and extended to protect linear slides 1110 and 1112 and a ball lead screw 1003, all in vacuum, from contamination.

Figure 10:
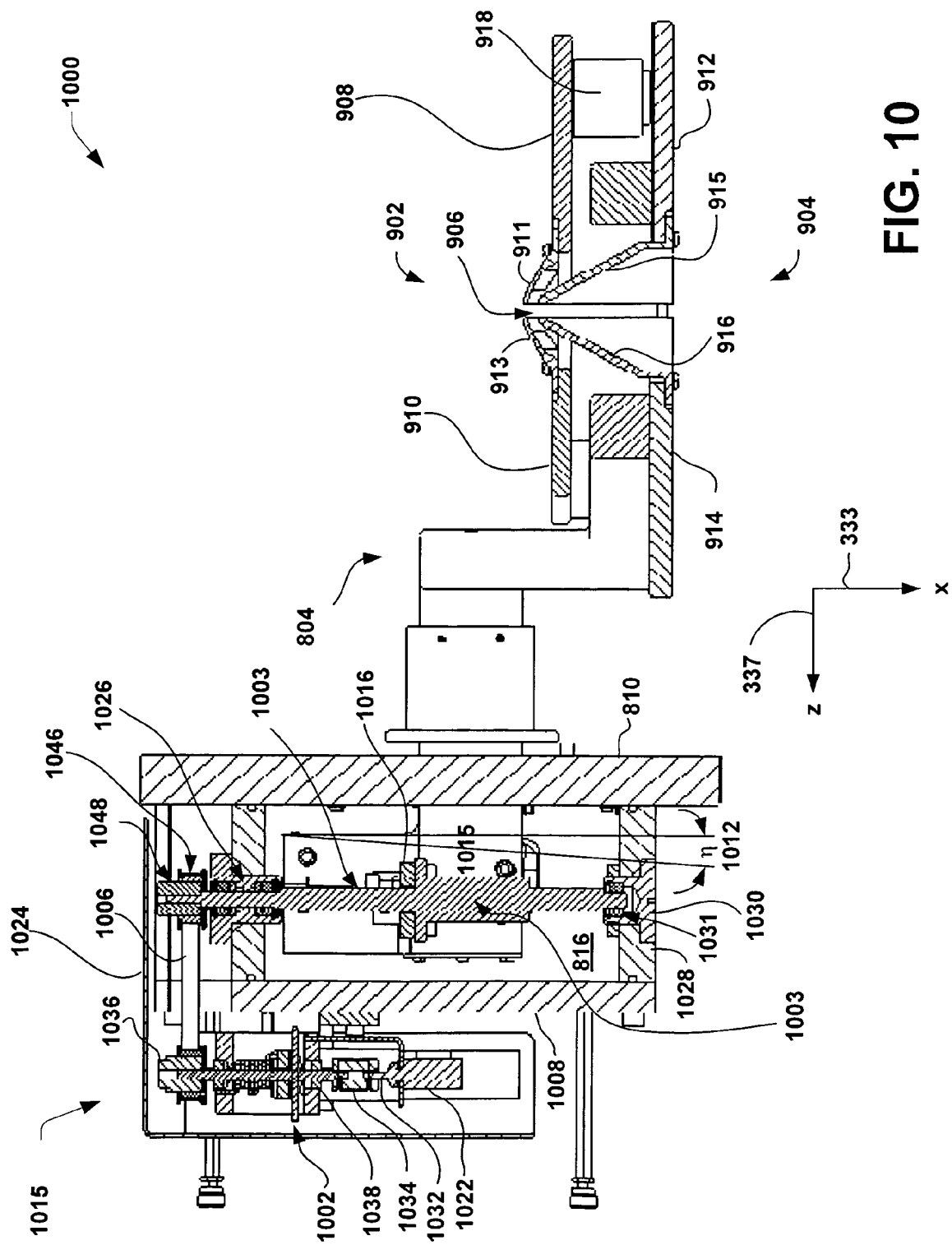
FIG. 10 is a cross-sectional view of an electrode manipulator according to yet another exemplary aspect of the invention.

FIG. 10 shows the electrode system as it would be inside of the source chamber, the supporting leg assemblies 802 and 804 (i.e., only 804 is visible) extend to the outside of the chamber through the opening on the supporting flange of the chamber mounting plate 810. The leg assemblies 802 and 804 are mounted on the moving mechanism structure 1015. The structure 1015 is mounted on the assembly chamber 816. The assembly chamber 816 is in the same vacuum system as the electrodes. The electrode assembly chamber 816 is mounted on the support flange mounting plate 810. The driving motor 1022 and transmission belt 1006 are outside of the chamber 816 and mounted on the sidewall 1008 of the chamber 816.

The electrode assembly chamber 816 (FIG. 8) encloses ends 1106 and 1108 (FIG. 11) of each support leg assemblies 802 and 804, respectively, and the support leg tracks 1102 and 1104. A chamber side wall 1008 (FIG. 10) can support a motor 1204 (FIG. 12), for example, that drives a planetary spur gear train 1206 that in turn is configured to drive a belt 1006 to turn a ball lead screw 1003. The ball lead screw 1003 having a first end that is connected to chamber wall 1028 by a bearing 1026 and an opposing end of the screw 1003 is rotatably attached to the chamber wall 1028 using a rotating bearing insert 1030 containing a bearing 1031. Therefore, the ball lead screw 1003, as illustrated in FIG. 10 is secured at its ends while being allowed to rotate about the x axis 333, for example. A bearing supported gear drive mechanism 1002 extends through the chamber wall 1008. A motor gear drive shaft 1032 is also rotatably secured at an upper end by a coupling 1034 that is fixed attached throughwith to a driven pulley assembly 1036 and at a lower end to a bearing 1038. The motor gear drive shaft 1032 is also connected to the potentiometer 1022 utilizing a coupling device 1040.

The driving motor 1204 rotates the shaft of the ball lead screw 1003 through a belt 1006. The two leg assemblies 802 and 804 are connected to the sides of the bearing support plate 1016 of ball lead screw 1003. Thus, when ball lead screw rotates, the plate 1016 moves forward or backward, both leg assemblies 802 and 804 will move forward or backward respectively. In this way, the gap 906 is adjusted.

Furthermore, the connection between the bearing support plate 1016 and the leg assemblies 802 and 804 are through two sliding tracks 1118 and 1120. The two sliding tracks 1118 and 1120 are on the two opposite sides of the bearing support plate 1016. The two tracks 1118 and 1120 are not parallel to the ball lead screw 1003, instead, one track has an first angle to the ball screw 1003, the other track has an opposite second angle to the ball screw 1003. When the bearing support plate 1016 moves, the two leg assemblies 802 and 804 not only move with the plate 1016, they can move apart from each other. In this way, the aperture 906 of the width changes. The driving mechanism is explained in detail below.

The respective support leg ends 1106 and 1108 of each support leg assembly (802 and 804) are slideably attached to support leg tracks (1102 and 1104), respectively. The tracks 1102 and 1104 are inclined with an angular inclination (μ) 1012 ((FIG. 10) in opposite directions.

Activating the motor 1204 (FIG. 12) drives the planetary spur gear train 1206 which in turn drives the belt 1006 and the lead screw 1003. The Lead screw 1003 is mechanically coupled to both of the support leg assemblies (802 and 804) through a bearing support plate 1016 attached to leg extensions 1114 and 1116 Movement of the driven bearing support plate 1016 moves the leg assemblies 802 and 804 in unison along their respective tracks 1102 and 1104. Since the tracks 1102 and 1104 are fixedly attached inside the electrode assembly chamber 816 utilizing flange assemblies 1208 and 1210, the linear slides 1118 and 1120 move along the x axis moving the leg assemblies 802 and 804 at the same time. The linear slides 1118 and 1120 are inclined at the angle of inclination μ 1012 in opposite directions, movement of the support leg assemblies 802 and 804 causes the extraction electrode gap 906 to diverge in width and at the same time varies the aperture width 906. This can be clearly seen in FIG. 11, for example, wherein as the linear slide 1120 is driven in the negative x direction by the lead screw 1003 the arm 804 moves in the positive z direction. However, as the linear slide 1118 concurrently moves in the negative x direction the arm 802 moves in the negative z direction, which results in a smaller gap 906.

In the preferred embodiment, the path of travel of the support leg assemblies 802 and 804 along their respective tracks 1102 and 1104 is approximately 2.5 inches. The tracks 1102 and 1104 are inclined at oppositely sloped angular inclinations (μ) 1012 of approximately 3.5 degrees from the predetermined beam line. The path of travel and the angular inclinations (μ) 1012 results in an extraction electrode gap width 906 of approximately 0.196 inches when the support leg assemblies 802 and 804 are at an end of their path of travel closest to the extraction electrode 336 and a gap width of approximately 0.502 at an end of their path of travel furthest from the extraction electrode 336. The gap 906 width measurement can be determined by a reading taken from the controller from a potentiometer 1022, for example.

In this way, the relation between the gap and the aperture can be determined. The gap is usually directly controlled in the operation. For a giving gap, the aperture is defined as, $$A = A_0 + \text{gap} * 2 * \text{TAN}(\text{ANGLE } \mu)$$

Wherein:

$A_0$ is the initial setup aperture at gap zero;

$A_0$ and the angle are usually determined by the beam focusing properties of the electrode system for different extraction voltages.

Figure 11:
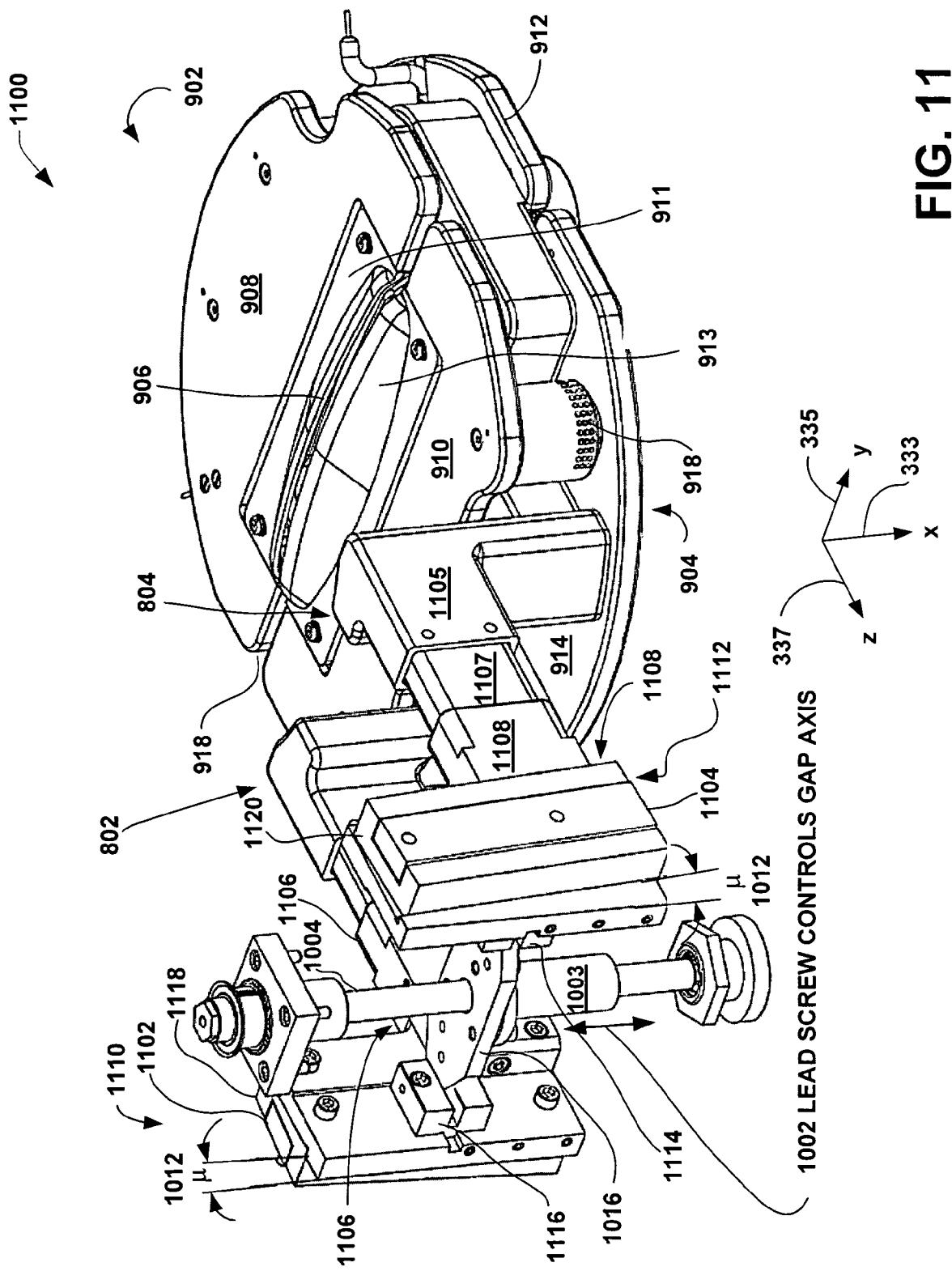
FIG. 11 is a another perspective view of an electrode manipulator according to an exemplary aspect of the invention.
Figure 12:
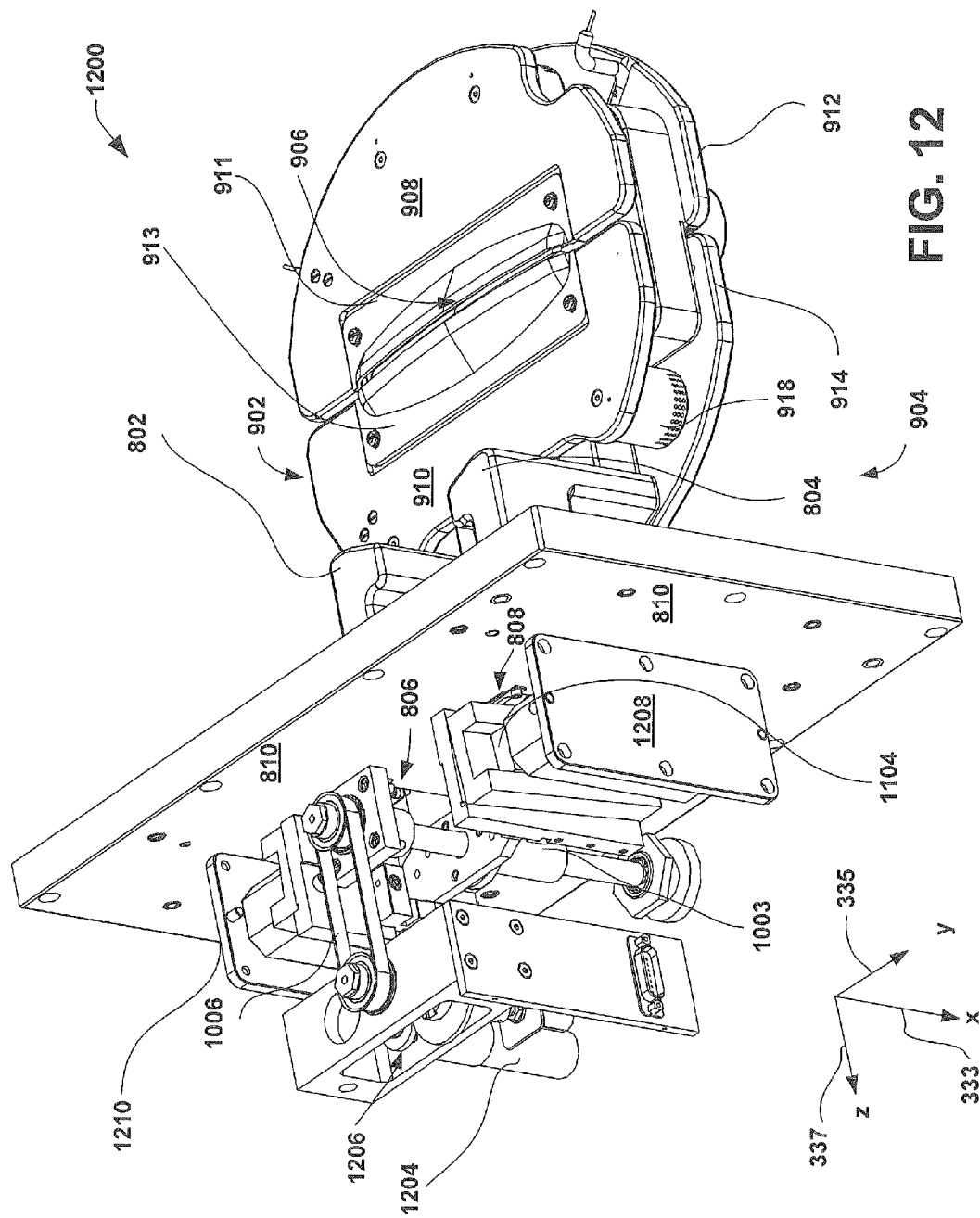
FIG. 12 is a another perspective view of an electrode manipulator according to an exemplary aspect of the invention.
Figure 13:
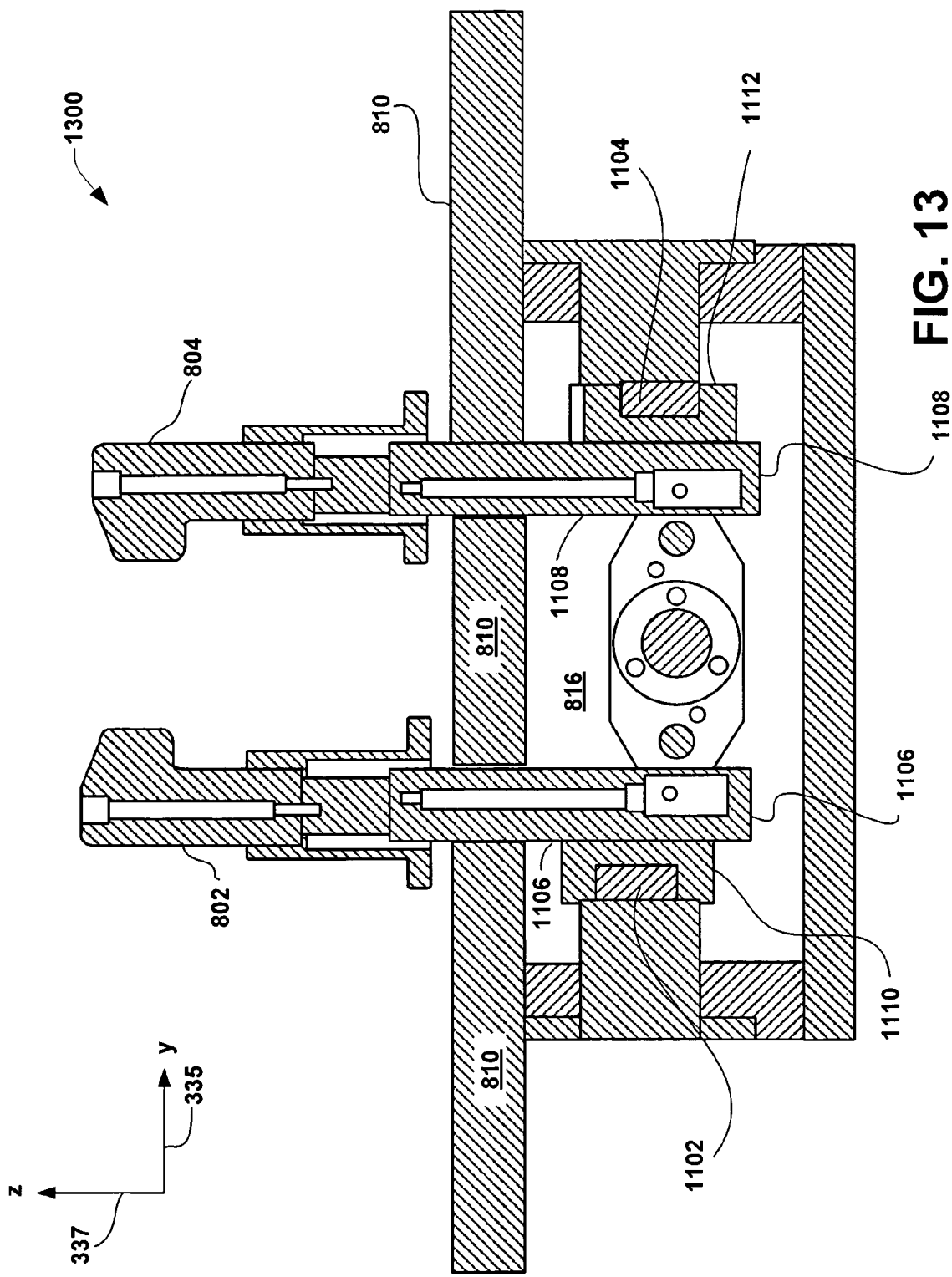
FIG. 13 is a cross-sectional view of an electrode manipulator according to another exemplary aspect of the invention.
Figure 14:
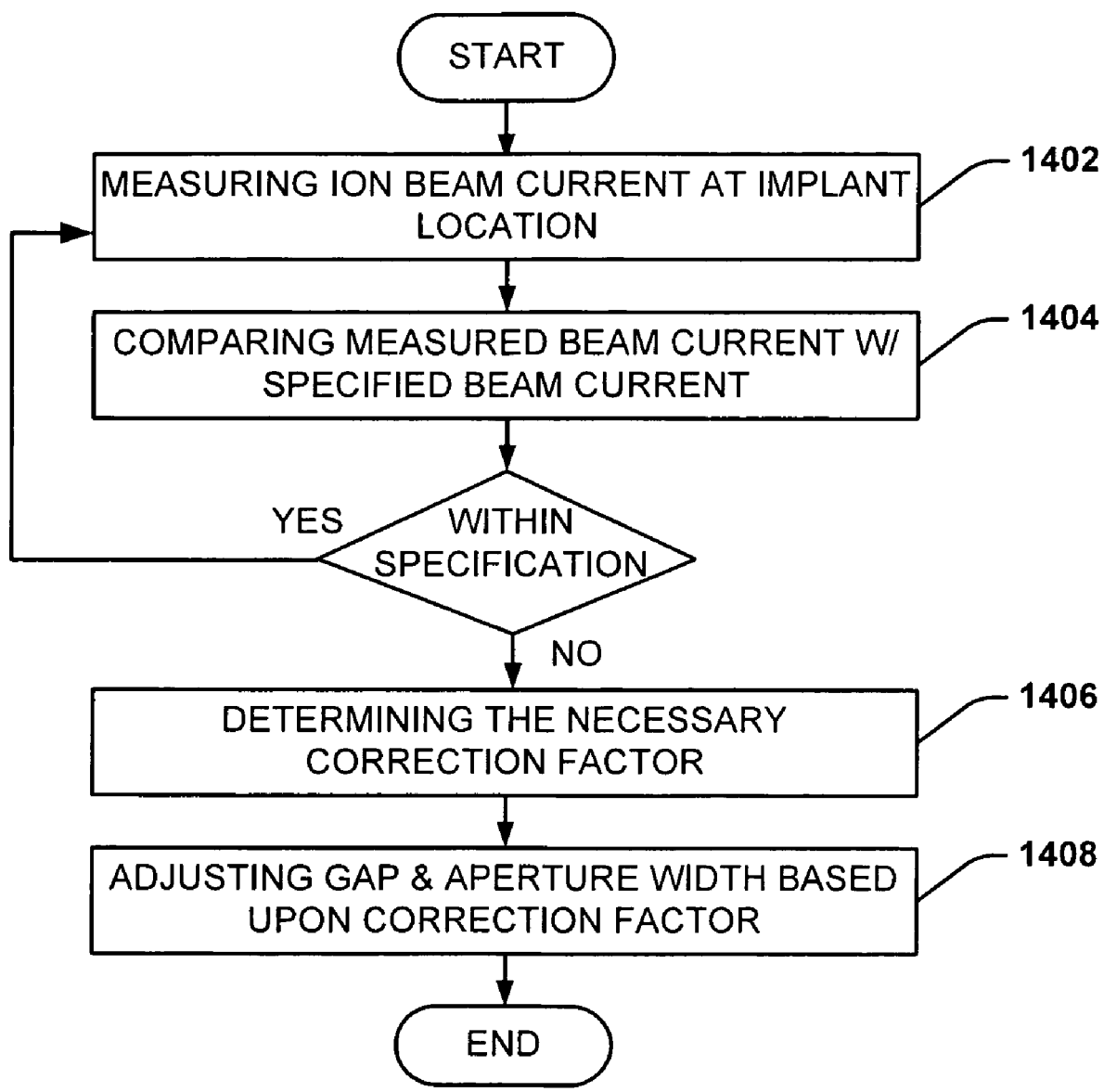
FIG. 14 is a flow chart diagram illustrating an electrode manipulator system according to yet another aspect of the present invention.
Figure 15:
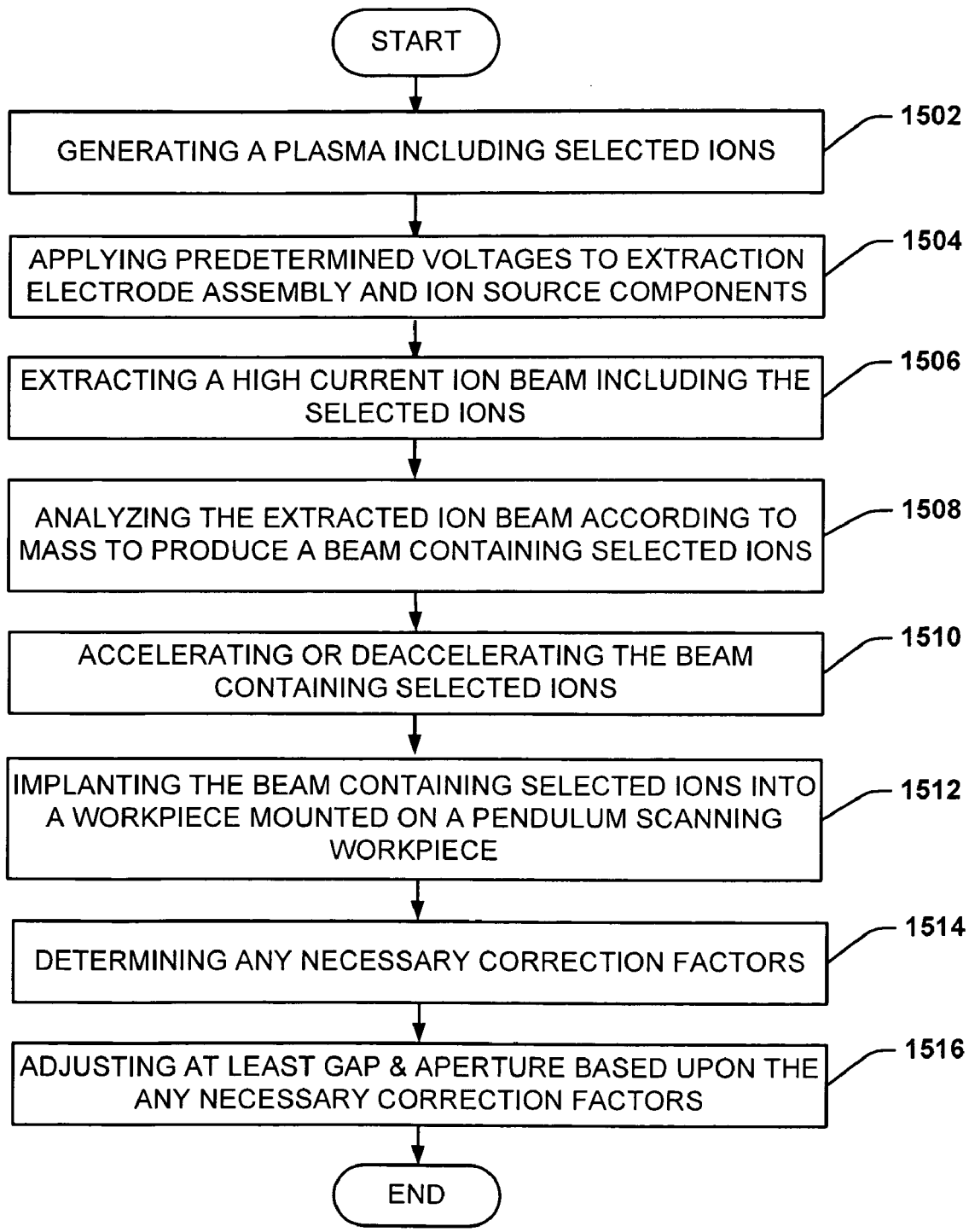
FIG. 15 is a flow chart diagram illustrating another electrode manipulator system according to yet another aspect of the present invention.

It should be noted that each leg assemblies 802 and 804 has three (3) sections, for example as shown in FIG. 11, leg assembly 804 has three sections, 1105, 1107 and 1108. The middle section 1107 (i.e., of each leg assembly) is an insulator enclosed by a cover. Therefore the leg is electrically insulated by the driving mechanism. The leg 804 is connected to the plate disk halves 912 for example. So, the ground electrode is actually electrically insulated from the ground. The ground electrodes are connected to a deceleration power supply. Therefore, this electrode system can operate at two modes:

drift mode, with the ground electrode grounded and deceleration mode, wherein the ground electrode is excited by the deceleration power supply.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A variable aperture electrode apparatus, comprising:
   an ion source comprising an extraction electrode, wherein the extraction electrode generally defines an extraction aperture in an outside wall of the ion source, and wherein the extraction electrode is configured to extract ions from the ion source, therein defining an ion beam;
   a suppression electrode positioned downstream of the extraction electrode, wherein the suppression electrode comprises first and second suppression electrode plate disk halves defining a variable suppression aperture therebetween, and wherein a gap is defined along a path of the ion beam between the extraction aperture and suppression aperture;
   a ground electrode positioned downstream of the suppression electrode by a predetermined distance along the path of the ion beam, wherein the ground electrode comprises first and second ground electrode plate disk halves defining a variable ground aperture therebetween; and
   a moving mechanism configured to concurrently translate the suppression electrode and ground electrode along the path of the ion beam along a first axis, wherein the gap between the extraction aperture and suppression aperture is variable based on the translation along the first axis, and wherein the moving mechanism is further configured to translate the first and second suppression electrode plate disk halves with respect to one another and to translate the first and second ground electrode plate disk halves with respect to one another, wherein the translation of the first and second suppression electrode plate disk halves and first and second ground electrode disk plate halves is parallel to a second axis generally perpendicular to the first axis.

2. The variable aperture electrode apparatus of claim 1, wherein the first suppression electrode plate disk half and first ground electrode plate disk half are generally fixed with respect to one another and are operably coupled to a first support leg, and wherein the second suppression electrode plate disk half and second ground electrode plate disk half are generally fixed with respect to one another and are operably coupled to a second support leg.

3. The variable aperture electrode apparatus of claim 2, wherein the moving mechanism is configured to linearly translate the first support leg and second support leg in unison along the first axis, and wherein the moving mechanism is further configured to linearly translate the first support leg and second support leg in opposite directions generally parallel to the second axis.

4. A variable aperture electrode apparatus, comprising:
   an ion source comprising an extraction electrode, wherein the extraction electrode generally defines an extraction aperture in an outside wall of the ion source, and wherein the extraction electrode is configured to extract ions from the ion source, therein defining an ion beam;
   a suppression electrode positioned downstream of the extraction electrode, wherein the suppression electrode comprises first and second suppression electrode plate disk halves defining a variable suppression aperture therebetween, and wherein a gap is defined along a path of the ion beam between the extraction aperture and suppression aperture;
   a ground electrode positioned downstream of the suppression electrode by a predetermined distance alone the ath of the ion beam wherein the round electrode comprises first and second ground electrode plate disk halves defining a variable ground aperture therebetween, wherein the first suppression electrode plate disk half and first ground electrode plate disk half are generally fixed with respect to one another and are operably coupled to a first support leg, and wherein the second suppression electrode plate disk half and second ground electrode plate disk half are generally fixed with respect to one another and are operably coupled to a second support leg; and
   a moving mechanism configured to concurrently translate the suppression electrode and ground electrode along the path of the ion beam along a first axis, wherein the gap between the extraction aperture and suppression aperture is variable based on the translation along the first axis, and wherein the moving mechanism is further configured to translate the first and second suppression electrode plate disk halves with respect to one another and to translate the first and second ground electrode plate disk halves with respect to one another, wherein the translation of the first and second suppression electrode plate disk halves and first and second ground electrode disk plate halves is parallel to a second axis generally perpendicular to the first axis, wherein the moving mechanism is configured to linearly translate the first support leg and second support leg in unison along the first axis, and wherein the moving mechanism is further configured to linearly translate the first support leg and second support leg in opposite directions generally parallel to the second axis, and wherein the first support leg is slidingly coupled to a first support leg track, and wherein the second support leg is slidingly coupled to a second support leg track, wherein the first support leg track and second support leg track are inclined at opposite angular slopes to the first axis, wherein the translation of the first support leg and second support leg along the first axis further translates the first suppression electrode plate disk half and first ground electrode plate disk half with respect to the second suppression electrode plate disk half and second ground electrode plate disk half generally parallel to the second axis.

5. The variable aperture electrode apparatus of claim 3, wherein the first support leg and second support leg are slidingly coupled to a bearing support plate, wherein the first support leg and second support leg are configured to translate generally parallel to the second axis, and wherein the moving mechanism is configured to translate the bearing support plate generally parallel to the first axis.

6. The variable aperture electrode apparatus of claim 5, wherein the moving mechanism comprises a lead screw operably coupled to the bearing support plate, wherein the lead screw is configured to linearly translate the bearing support plate generally parallel to the first axis.

7. The variable aperture electrode apparatus of claim 1, further comprising one or more suppression insulators positioned between the suppression electrode and the ground electrode, therein electrically insulating the suppression electrode from the ground electrode.

8. An ion implantation system, comprising:
   an ion source comprising an arc chamber, wherein the ion source further comprises an extraction electrode generally defining an extraction aperture in an outside wall of the arc chamber, and wherein the extraction electrode is configured to extract ions from the arc chamber, therein defining an ion beam;
   a variable aperture electrode apparatus positioned downstream of the ion source, the variable aperture electrode apparatus comprising:
      a suppression electrode positioned, wherein the suppression electrode comprises first and second suppression electrode plate disk halves defining a variable suppression aperture therebetween, and wherein a gap is defined along a path of the ion beam between the extraction aperture and suppression aperture;
      a ground electrode positioned downstream of the suppression electrode by a predetermined distance along the path of the ion beam, wherein the ground electrode comprises first and second ground electrode plate disk halves defining a variable ground aperture therebetween; and
      a moving mechanism configured to concurrently translate the suppression electrode and ground electrode along the path of the ion beam along a first axis, wherein the gap between the extraction aperture and suppression aperture is variable based on the translation along the first axis, and wherein the moving mechanism is further configured to translate the first and second suppression electrode plate disk halves with respect to one another and to translate the first and second ground electrode plate disk halves with respect to one another, wherein the translation of the first and second suppression electrode plate disk halves and first and second ground electrode disk plate halves is parallel to a second axis generally perpendicular to the first axis;
   a beamline assembly positioned downstream of the variable aperture electrode apparatus, wherein the beamline assembly is configured to mass analyze the ion beam; and
   an end station positioned downstream of the beamline assembly, wherein the end station is configured to translate a workpiece through the ion beam.

9. The ion implantation system of claim 8, wherein the extraction aperture, the variable suppression aperture, and the variable ground aperture provide fluid communication between an interior region of the arc chamber and the beamline assembly.

10. The ion implantation system of claim 8, further comprising:
   a source power supply electrically connected to the ion source;
   an extraction power supply electrically connected to the extraction electrode, wherein an extraction voltage from the extraction power supply is configured to have a potential relative a source voltage from the source power supply in order to extract and accelerate ions from the ion source;
   a suppression power supply electrically coupled between the suppression electrode and the ground electrode, wherein the suppression voltage supply is configured to provide a negative potential relative to the extraction electrode, and wherein the ground electrode is electrically grounded.

11. The ion implantation system of claim 8, wherein the first suppression electrode plate disk half and first ground electrode plate disk half are generally fixed with respect to one another and are operably coupled to a first support leg, and wherein the second suppression electrode plate disk half and second ground electrode plate disk half are generally fixed with respect to one another and are operably coupled to a second support leg.

12. The ion implantation system of claim 11, wherein the moving mechanism is configured to linearly translate the first support leg and second support leg in unison along the first axis, and wherein the moving mechanism is further configured to linearly translate the first support leg and second support leg in opposite directions generally parallel to the second axis.

13. An ion implantation system, comprising:
   an ion source comprising an arc chamber, wherein the ion source further comprises an extraction electrode generally defining an extraction aperture in an outside wall of the arc chamber, and wherein the extraction electrode is configured to extract ions from the arc chamber, therein defining an ion beam;
   a variable aperture electrode apparatus positioned downstream of the ion source, the variable aperture electrode apparatus comprising:
      a suppression electrode positioned, wherein the suppression electrode comprises first and second suppression electrode plate disk halves defining a variable suppression aperture therebetween, and wherein a gap is defined along a path of the ion beam between the extraction aperture and suppression aperture;
      a ground electrode positioned downstream of the suppression electrode by a predetermined distance along the path of the ion beam, wherein the ground electrode comprises first and second ground electrode plate disk halves defining a variable ground aperture therebetween, wherein the first suppression electrode plate disk half and first ground electrode plate disk half are generally fixed with respect to one another and are operably coupled to a first support leg, and wherein the second suppression electrode plate disk half and second ground electrode plate disk half are generally fixed with respect to one another and are operably coupled to a second support leg; and
      a moving mechanism configured to concurrently translate the suppression electrode and ground electrode along the path of the ion beam along a first axis, wherein the gap between the extraction aperture and suppression aperture is variable based on the translation along the first axis, and wherein the moving mechanism is further configured to translate the first and second suppression electrode plate disk halves with respect to one another and to translate the first and second ground electrode plate disk halves with respect to one another, wherein the translation of the first and second suppression electrode plate disk halves and first and second ground electrode disk plate halves is parallel to a second axis generally perpendicular to the first axis, and wherein the moving mechanism is configured to linearly translate the first support leg and second support leg in unison along the first axis, and wherein the moving mechanism is further configured to linearly translate the first support leg and second support leg in opposite directions generally parallel to the second axis, wherein the first support leg is slidingly coupled to a first support leg track, and wherein the second support leg is slidingly coupled to a second support leg track, wherein the first support leg track and second support leg track are inclined at opposite angular slopes to the first axis, wherein the translation of the first support leg and second support leg along the first axis further translates the first suppression electrode plate disk half and first ground electrode plate disk half with respect to the second suppression electrode plate disk half and second ground electrode plate disk half generally parallel to the second axis;

a beamline assembly positioned downstream of the variable aperture electrode apparatus, wherein the beamline assembly is configured to mass analyze the ion beam; and an end station positioned downstream of the beamline assembly, wherein the end station is configured to translate a workpiece through the ion beam.

14. The ion implantation system of claim 12, wherein the first support leg and second support leg are slidingly coupled to a bearing support plate, wherein the first support leg and second support leg are configured to translate generally parallel to the second axis, and wherein the moving mechanism is configured to translate the bearing support plate generally parallel to the first axis.

15. The ion implantation system of claim 14, wherein the moving mechanism comprises a lead screw operably coupled to the bearing support plate, wherein the lead screw is configured to linearly translate the bearing support plate generally parallel to the first axis.

16. The ion implantation system of claim 8, further comprising one or more suppression insulators positioned between the suppression electrode and the ground electrode, therein electrically insulating the suppression electrode from the ground electrode.

17. The ion implantation system of claim 8, further comprising a controller configured to control the gap between the extraction aperture and suppression aperture, the translation of the first and second suppression electrode plate disk halves with respect to one another, and the translation of the first and second ground electrode plate disk halves with respect to one another via a control of the moving mechanism.

18. A method for controlling ion beam current at an implant location, the method comprising:

providing an ion source having an extraction electrode in an outside wall of the ion source;

providing a suppression electrode having a variable suppression aperture downstream of the extraction electrode, wherein a gap between the suppression electrode and the extraction electrode is variable;

providing a ground electrode having a variable ground aperture downstream of the suppression electrode;

measuring the ion beam current at the implant location; and concurrently controlling the gap between the extraction electrode and the suppression electrode, a width of the variable suppression aperture, and a width of the variable ground aperture, based on the measured ion beam current.

19. The method of claim 18, wherein concurrently controlling the gap between the extraction electrode and the suppression electrode, the width of the variable suppression aperture, and the width of the variable ground aperture comprises:

concurrently translating the suppression electrode and ground electrode along the path of the ion beam along a first axis, wherein the gap between the extraction aperture and suppression aperture is based on the translation along the first axis;

translating first and second suppression electrode plate disk halves of the suppression electrode with respect to one another; and translating first and second ground electrode plate disk halves of the ground electrode with respect to one another, wherein the translation of the first and second suppression electrode plate disk halves and first and second ground electrode disk plate halves is parallel to a second axis generally perpendicular to the first axis.

20. The method of claim 19, wherein translating the suppression electrode and ground electrode, translating the first and second suppression electrode plate disk halves, and translating the first and second ground electrode plate disk halves comprises translating the first suppression electrode plate disk half and first ground electrode plate disk half in unison along the second axis with respect to the second suppression electrode plate disk half and second ground electrode plate disk half, while concurrently translating the suppression electrode and ground electrode along the first axis.

* * * * *